(12) United States Patent
Ohmae et al.

(10) Patent No.: US 9,142,748 B2
(45) Date of Patent: Sep. 22, 2015

(54) LIGHT EMITTING DEVICE, DISPLAY DEVICE, AND MANUFACTURING METHOD FOR LIGHT EMITTING DEVICE

(71) Applicant: Panasonic Intellectual Property Management Co., Ltd., Osaka (JP)

(72) Inventors: Hideki Ohmae, Hyogo (JP); Junichi Hibino, Osaka (JP); Atsushi Yamada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 2 days.

(21) Appl. No.: 14/572,771

(22) Filed: Dec. 17, 2014

(65) Prior Publication Data

US 2015/0179905 A1    Jun. 25, 2015

(30) Foreign Application Priority Data

Dec. 24, 2013  (JP) ................................. 2013-266135

(51) Int. Cl.
| | |
|---|---|
| H01L 33/20 | (2010.01) |
| H01L 33/62 | (2010.01) |
| H01L 27/15 | (2006.01) |
| H01L 33/52 | (2010.01) |
| H01L 33/00 | (2010.01) |

(52) U.S. Cl.
CPC .............. *H01L 33/62* (2013.01); *H01L 27/156* (2013.01); *H01L 33/005* (2013.01); *H01L 33/52* (2013.01); *H01L 2933/0066* (2013.01)

(58) Field of Classification Search
CPC ................. H01L 2924/00; H01L 2224/73265; H01L 2224/48227; H01L 2924/00014
See application file for complete search history.

(56) References Cited

U.S. PATENT DOCUMENTS

| | | | |
|---|---|---|---|
| 2002/0064032 A1* | 5/2002 | Oohata | 361/760 |
| 2005/0029529 A1* | 2/2005 | Yukimoto et al. | 257/79 |
| 2005/0057939 A1* | 3/2005 | Mizuyoshi | 362/505 |

FOREIGN PATENT DOCUMENTS

| | | |
|---|---|---|
| JP | 8-054840 | 2/1996 |
| JP | 2007-287849 | 11/2007 |
| JP | 2012-119428 | 6/2012 |

* cited by examiner

*Primary Examiner* — Jaehwan Oh
(74) *Attorney, Agent, or Firm* — Greenblum & Bernstein P.L.C.

(57) ABSTRACT

A light emitting device in which a plurality of LED chips are arranged. Each of the plurality of LED chips include a light emitting region that is formed on a substrate, a first pad electrode that is formed on the substrate, and a through-hole that penetrates the substrate. First wiring that passes through the through-hole of one LED chip and the through-hole of an adjacent LED chip, and electrically connects the first pad electrode of the one LED chip and the first pad electrode of the adjacent LED chip is provided. The tip-end parts of the first wiring that have passed through the through-holes have, at a cross section cut at a plane that is parallel with a principal surface of the substrate, a larger cross-sectional area than the cross-sectional area of the first wiring inside the through-holes.

11 Claims, 36 Drawing Sheets

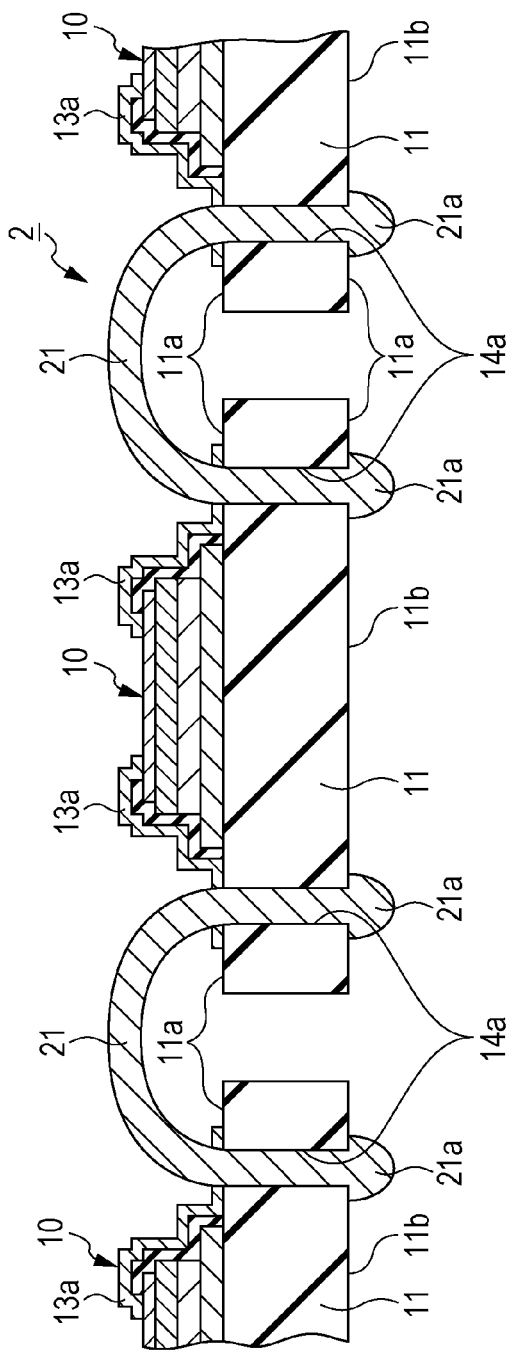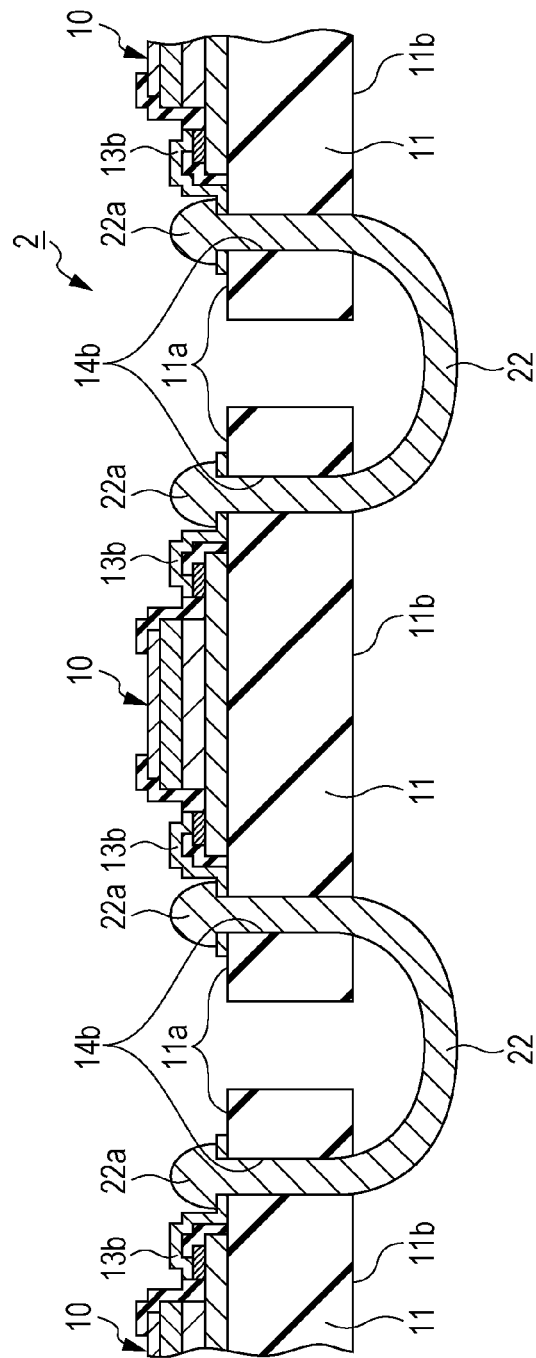

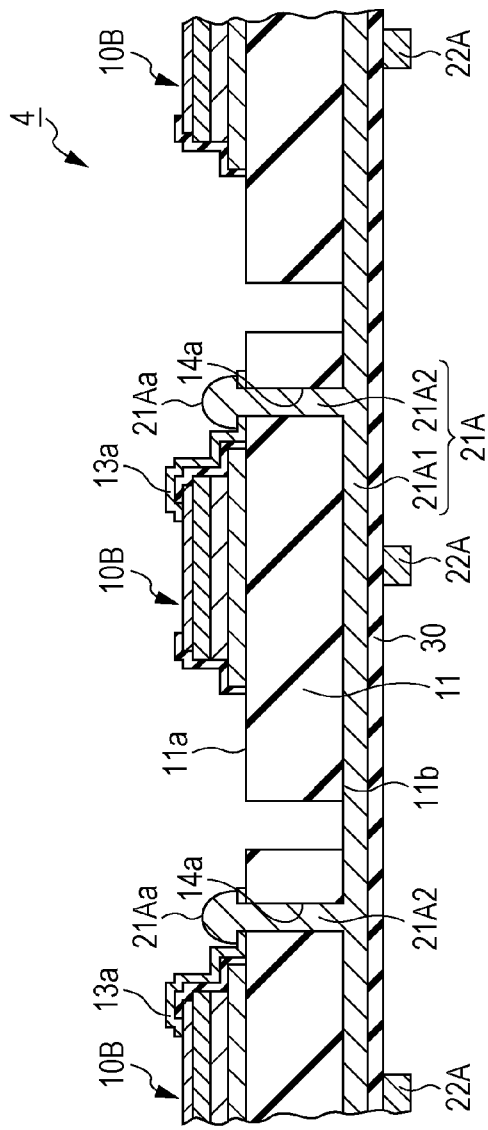
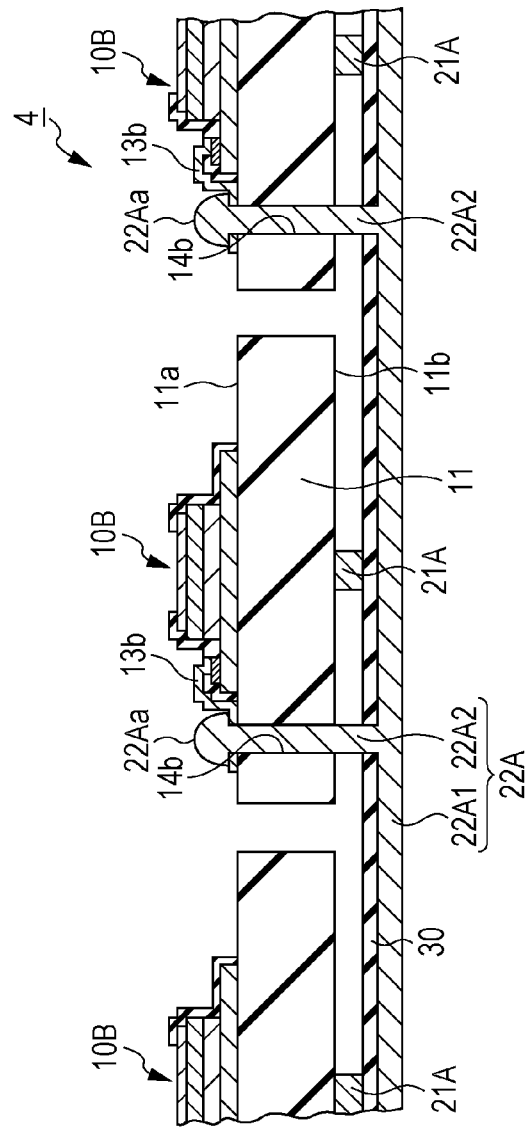
FIG. 22A
FIG. 22B

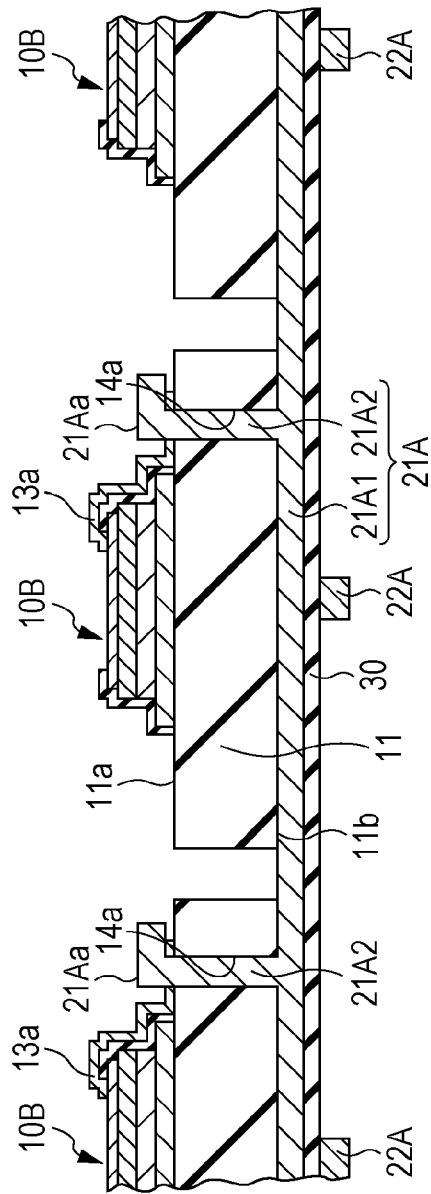
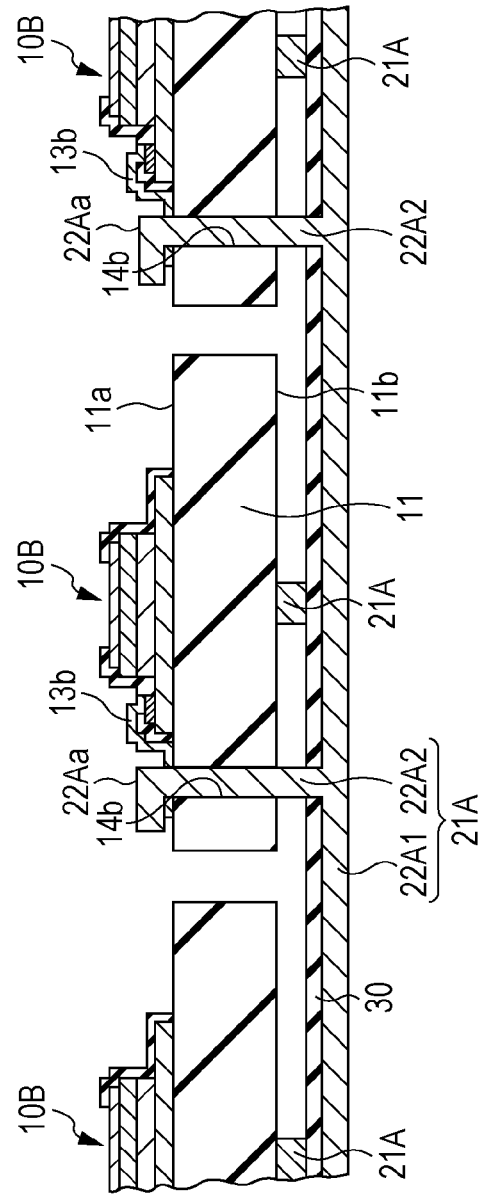
FIG. 23A
FIG. 23B

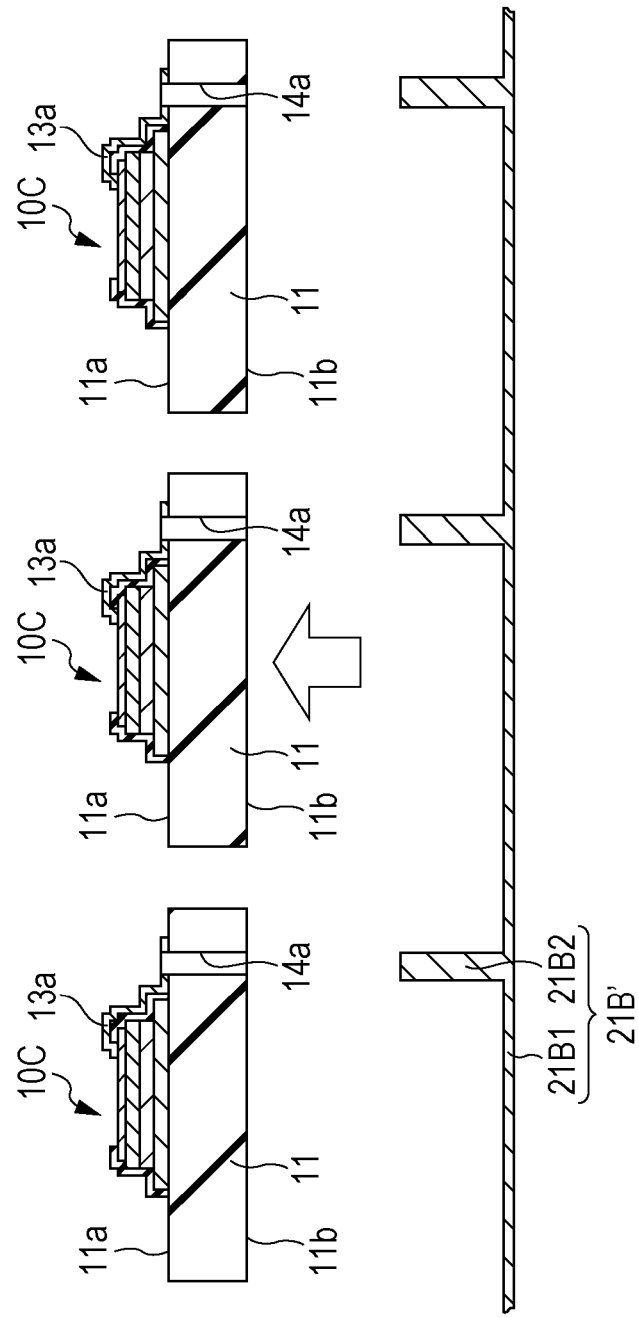

LIGHT EMITTING DEVICE, DISPLAY DEVICE, AND MANUFACTURING METHOD FOR LIGHT EMITTING DEVICE

CROSS REFERENCES TO RELATED APPLICATIONS

This Application claims priority to Japanese Patent Application No. 2013-266135, filed on Nov. 24, 2013, the contents of which are hereby incorporated by reference.

BACKGROUND

1. Technical Field

The present disclosure relates to a light emitting device, a display device, and a manufacturing method for a light emitting device.

2. Description of the Related Art

Light emitting elements such as light emitting diodes (LEDs) are widely used as light sources for various products, for display uses and illumination uses and the like.

A known example of a display use is a display device in which a large number of light emitting elements are regularly arranged and mounted, and these light emitting elements are appropriately turned on and off such that predetermined characters, graphics, or symbols or the like are displayed.

In the display device disclosed in Japanese Unexamined Patent Application Publication No. 8-054840, a circuit board is used in which conductors in the shape of thin plates are arranged in a grid-like manner, either the vertical rows or the horizontal rows of the conductors are set as an anodes, the other are set as cathodes, and light emitting elements are mounted at the intersecting positions of the vertical rows and the horizontal rows. A display device that has appropriate flexibility is thereby realized.

SUMMARY

The present disclosure provides a light emitting device and the like with which it is possible to suppress a load that is applied to a connection portion between wiring and an electrode.

A light emitting device according to an aspect of the present disclosure is a light emitting device including a plurality of LED chips comprising a first LED chip and a second LED chip. Each of the plurality of LED chips includes a substrate; a light emitting region that is formed on the substrate; an electrode that is connected to the light emitting region and is formed on the substrate; one or more through-holes that penetrate the substrate; and one or more wirings. Each of one or more wirings passes through the one or more through-holes of the first LED chip and the one or more through-holes of the second LED chip that is adjacent to the first LED chip. Each of one or more wirings electrically connects the electrode of the first LED chip and the electrode of the second LED chip. With regard to each of the first LED chip and the second LED chip, a tip-end part of each of the one or more wirings passing through the one or more through-holes has, at a cross section when cut at a plane that is parallel with a first principle surface of the substrate, a larger cross-sectional area than a cross-sectional area of each of the one or more wirings inside the one or more through-holes. The substrate of the first LED chip and the substrate of the second LED chip are separated, and the each of the one or more wirings links the first LED chip and the second LED chip.

A light emitting device of an aspect of according to the present disclosure is able to suppress a load that is applied to a connection portion between wiring and an electrode.

Additional benefits and advantages of the disclosed embodiments will be apparent from the specification and Figures. The benefits and/or advantages may be individually provided by the various embodiments and features of the specification and Figures, and need not all be provided in order to obtain one or more of the same.

BRIEF DESCRIPTION OF THE DRAWINGS

FIG. 10A illustrates the connection relationship between LED chips and first wiring in the light emitting device according to embodiment 2.

FIG. 10B illustrates the connection relationship between LED chips and second wiring in the light emitting device according to embodiment 2.

FIG. 22A illustrates the connection relationship between LED chips and first wiring in the light emitting device according to embodiment 4.

FIG. 22B illustrates the connection relationship between LED chips and second wiring in the light emitting device according to embodiment 4.

FIG. 23A illustrates the connection relationship between LED chips and first wiring in a light emitting device according to modified example 1 of embodiment 4.

FIG. 23B illustrates the connection relationship between LED chips and second wiring in the light emitting device according to modified example 1 of embodiment 4.

FIG. 33 illustrates a wiring insertion step (before insertion) in a manufacturing method for a light emitting device according to modified example 1 of embodiment 6.

Figure 1A:
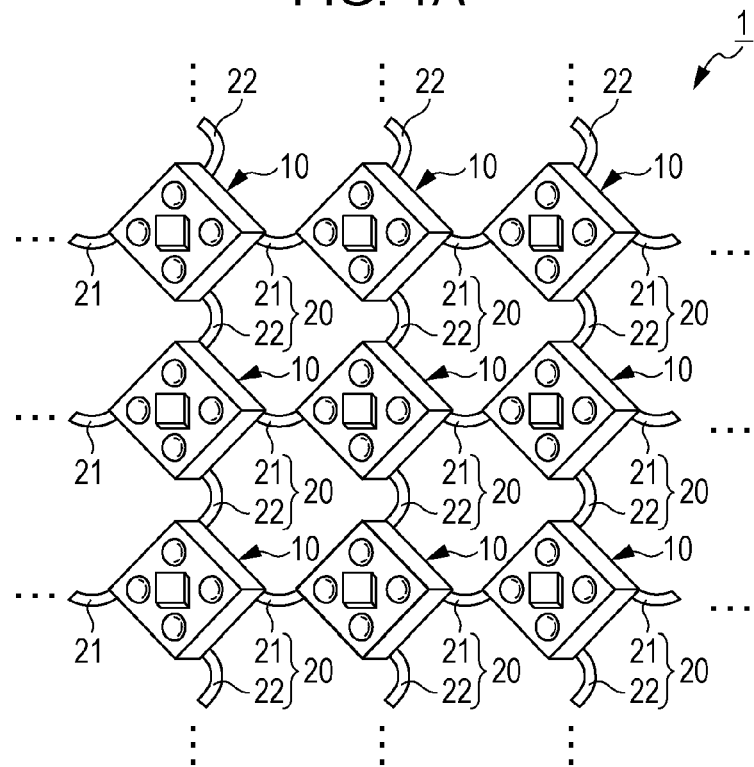
FIG. 1A is a schematic view showing the configuration of a light emitting device according to embodiment 1.

DETAILED DESCRIPTION (Findings Forming the Basis for the Present Disclosure)

In a conventional display device, there is a problem in that when a circuit board is used being flexed to have a curved surface, it is easy for a load to be applied to a connection portion between a conductor and a light emitting element, and a fault such as a defect in electrical continuity occurs.

For example, it is easy for a load to be applied to a connection portion between wiring that is a conductor and an electrode of a light emitting element. When a load is applied to the connection portion between the wiring and the electrode, there are occasions where a crack occurs in the connection portion such that there is defective contact, the wiring and the electrode separate such that there is a disconnection defect, and the electrode detaches from the substrate together with the wiring.

After diligent investigation, the present inventors and others therefore conceived of a light emitting device and the like with which it is possible to suppress a load that is applied to a connection portion between wiring and an electrode.

Embodiments of the Disclosure

A light emitting device of an aspect of according to the present disclosure is a light emitting device including a plurality of LED chips comprising a first LED chip and a second LED chip. Each of the plurality of LED chips includes a substrate; a light emitting region that is formed on the substrate; an electrode that is connected to the light emitting region and is formed on the substrate; one or more through-holes that penetrate the substrate; and one or more wirings. Each of one or more wirings passes through the one or more through-holes of the first LED chip and the one or more through-holes of the second LED chip that is adjacent to the first LED chip. Each of one or more wirings electrically connects the electrode of the first LED chip and the electrode of the second LED chip. With regard to each of the first LED chip and the second LED chip, a tip-end part of each of the one or more wirings passing through the one or more through-holes has, at a cross section when cut at a plane that is parallel with a first principle surface of the substrate, a larger cross-sectional area than a cross-sectional area of each of the one or more wirings inside the one or more through-holes. The substrate of the first LED chip and the substrate of the second LED chip are separated, and the each of the one or more wirings links the first LED chip and the second LED chip.

According to the aspect of the present disclosure, wiring is provided that passes through the through-hole of first LED chip of the LED chips and the through-hole of a second LED chip of the LED chips that is adjacent to the first LED chip, and electrically connects the electrode of the first LED chip and the electrode of the second LED chip.

Furthermore, the wiring links the first LED chip and the second LED chip.

In other words, the wiring has the function of electrically connecting the electrode of the first LED chip and the electrode of the second LED chip, and is also provided with the function of linking the first LED chip and the second LED chip.

Thus, the substrate of the first LED chip and the substrate of the second LED chip are separated, or in other words, the substrate of the first LED chip and the substrate of the second LED chip are not linked, and the wiring links the first LED chip and the second LED chip. Therefore, if the light emitting device according to the present embodiment is used, it is possible to easily realize a display device, for example, that has appropriate flexibility.

Furthermore, according to the aspect of the present disclosure, the wiring that links the LED chips passes through the through holes in the substrate, and is connected to the electrodes of the LED chips.

Thus, the movement range of the wiring is limited, and it is therefore possible to suppress a load applied to connection portions between the wiring and the electrodes of the LED chips.

Therefore, it is possible to reduce the occurrence of defects in electrical continuity and the like in the connection portions even when the light emitting device is flexed in such a way as to be curved.

In addition, according to the aspect of the present disclosure, a tip-end part of the wiring that has passed through the through-hole has, at a cross section when cut at a plane that is parallel with a principle surface of the substrate, a larger cross-sectional area than a cross-sectional area of the wiring inside the through-hole.

Thus, it is possible, for each LED chip, to link and fix the wiring and the LED chip without the wiring detaching from the through-hole, and it is therefore possible to use the wiring to easily link the plurality of LED chips even when the wiring is a thin wire material.

According to the aspect of the present disclosure, because the wiring is provided for each of the adjacent LED chips, it is possible for the plurality of LED chips to be easily linked compared to when the plurality of LED chips are linked with a single wire continuously passing through the through-holes of the LED chips from top to bottom in an alternating manner.

Furthermore, in the aforementioned aspect of the present disclosure, the tip-end part of the wiring that has passed through the through-hole may be bent along the first principle surface of the substrate.

According to the aspect of the present disclosure, it is possible for the plurality of LED chips to be easily linked.

Furthermore, in the aforementioned aspect of the present disclosure, the tip-end part of the wiring that has passed through the through-hole may be present on the second principle surface that is on the opposite side of the substrate to the first principle surface on which the light emitting region is formed.

According to the aspect of the present disclosure, it is possible to increase the length of the tip-end part of the bent portion, and it is therefore possible to securely fix the wiring and an LED chip, and it is possible to further reduce defects in electrical continuity when the light emitting device is flexed. In addition, because the wiring is bent at the principal surface of the substrate on which the light emitting region is not formed, it is possible to avoid the light emitting region being damaged when the wiring is bent. Moreover, by bending the wiring at the principal surface of the substrate on which the light emitting region is not formed, it is possible for bending processing for the wiring to be easily carried out, such as a plurality of wiring being bent at the same time.

Furthermore, in the aforementioned aspect of the present disclosure, each of the one or more wirings may have a stretchable structure between two of the LED chips that are adjacent to each other.

According to the aspect of the present disclosure, it is possible for the bending stress (load) of the wiring that occurs when the light emitting device is flexed to be absorbed by the stretchable structure.

Furthermore, in the aforementioned aspect of the present disclosure, each of the one or more wirings may have a main wiring part that connects three or more of the LED chips, and an auxiliary wiring part that branches from the main wiring part to each of the LED chips. The main wiring part may be formed along the second principle surface that is on the opposite side of the substrate to the first principle surface on which the light emitting region is formed, and the auxiliary wiring part may be positioned inside the one or more through-holes.

According to the aspect of the present disclosure, it is possible for many LED chips to be linked the same time, and it is therefore possible for linking work for the wiring and the LED chips to be carried out in a short time.

Furthermore, in the aforementioned aspect of the present disclosure, the plurality of LED chips further comprises a third LED chip that is adjacent to the first LED chip. Each of the one or more wirings may include first wiring that is inserted through a first through-hole in the first LED chip and a first through-hole in the second LED chip from the first principal surface of the substrate, and second wiring that is inserted through a second through-hole in the first LED chip and a second through-hole in the second LED chip from a second principal surface of the substrate that is on the opposite side of the substrate to the first principle surface.

According to the aspect of the present disclosure, the first wiring and the second wiring are positioned with an LED chip therebetween, and it is therefore possible to suppress short-circuiting between the first wiring the second wiring even if the light emitting device is flexed.

Furthermore, in the aforementioned aspect of the present disclosure, the cross-sectional area of each of the one or more through-holes may be larger than the cross-sectional area of each of the one or more wirings inside the one or more through-holes.

According to the aspect of the present disclosure, if the light emitting device is flexed, it is possible for the wiring to have a degree of flexibility due to a gap inside the through-hole, and it is therefore possible to reduce the possibility of the wiring breaking at the opening end of the through-hole. Furthermore, if the light emitting device is flexed, because there is a gap inside the through-hole, it is possible to alleviate the bent state of the wiring that curves, and it is therefore possible to reduce the bending stress load that is applied to the wiring.

Furthermore, in the aforementioned aspect of the present disclosure, the plurality of LED chips may be packaged with a resin that is more pliable than the one or more wirings.

According to the aspect of the present disclosure, it is possible to maintain the flexibility of a display device, for example, in which the light emitting device according to the present embodiment is used, while also strengthening the link between the plurality of LED chips connected by the wiring.

Furthermore, in the aforementioned aspect of the present disclosure, the plurality of LED chips further may include a third LED chip that is adjacent to the first LED chip at a side different from the second LED chip, and first wiring and second wiring pass through the through-hole of the first LED chip, the first wiring electrically connecting the electrode of the second LED chip and the electrode of the first LED chip, and the second wiring electrically connecting the electrode of the third LED chip and the electrode of the first LED chip.

According to the aspect of the present disclosure, first wiring to which the electrode of the second LED chip and the electrode of the first LED chip are electrically connected, and second wiring to which the electrode of the third LED chip and the electrode of the first LED chip are electrically connected are inserted through the through-hole of the first LED chip. Therefore, it is sufficient for the first LED chip to have one common through-hole in order to link the first LED chip to the second LED chip and the third LED chip, and the configuration is therefore simplified.

Furthermore, in the aforementioned aspect of the present disclosure, the pore diameter of each of one or more through-holes may widen toward a second principle surface on the opposite side to the first principle surface of the substrate on which the light emitting region is formed.

According to the aspect of the present disclosure, it is possible to reduce the possibility of the wiring breaking at the opening end of the through-hole. Furthermore, if the light emitting device is flexed, it is possible to alleviate the bent state of the wiring that curves, and it is therefore possible to reduce the bending stress load that is applied to the wiring.

Furthermore, a display device according to the aspect of the present disclosure is provided with a light emitting device of any of the aforementioned descriptions.

According to the aspect of the present disclosure, it is possible to realize a cloth-like display device that has appropriate flexibility.

Furthermore, a manufacturing method for a light emitting device according to an aspect of the present disclosure is a manufacturing method for a light emitting device in which a plurality of LED chips are arranged, the manufacturing method includes: forming, in a substrate, one or more through-holes that penetrate the substrate; forming a plurality of light emitting regions on the substrate; forming a plurality of electrodes on the substrate; dividing the substrate to form the plurality of LED chips comprising a first LED chip and a second LED chip, each LED chip including at least one of the through-holes, at least one of the light emitting regions, and at least one of the electrodes; inserting one or more wirings through the one or more through-holes to connect the electrode of a first LED chip and the electrode of a second LED chip from among the plurality of LED chips; and processing a tip end of each of the one or more wirings inserted through the one or more through-holes, to have, at a cross section when cut at a plane that is parallel with a principle surface of the substrate, a larger cross-sectional area than the cross-sectional area of each of the wirings inside one or more the through-holes.

According to the aspect of the present disclosure, it is possible to use the wiring to easily link the plurality of LED chips even when the wiring is a thin wire material, and it is therefore possible to easily manufacture a light emitting device with which it is possible to reduce the occurrence of defects in electrical continuity and the like in connection portions between the wiring and the LED chips even if the light emitting device is flexed in such a way as to be curved.

Furthermore, in the aforementioned aspect of the manufacturing method for a light emitting device according to the present disclosure, in the processing of the tip end of the wiring, the tip end of the wiring inserted through the through-holes may be welded by a welding apparatus.

Alternatively, in the aforementioned aspect of the manufacturing method for a light emitting device according to the present disclosure, in the processing of the tip end of the wiring, the tip end of the wiring inserted through the through-holes may be welded by a pressure welding apparatus.

Hereinafter, embodiments of the present disclosure are described using the drawings. It should be noted that the embodiments described hereinafter all represent a specific example of the present disclosure. Therefore, the numerical values, the shapes, the materials, the constituent elements, the arrangement positions and the manner of connection of the constituent elements, the steps, and the order of the steps and the like given in the embodiments hereinafter are examples and are not intended to restrict the present disclosure. Accordingly, from among the constituent elements in the embodiments hereinafter, constituent elements that are not described in the independent claims indicating the most significant concepts of the present disclosure are described as optional constituent elements.

It should be noted that the drawings are schematic views, and that the drawings have not necessarily been illustrated in an exact manner. Furthermore, in the drawings, the same reference symbols have been appended to configurations that are substantially the same, and redundant descriptions have been omitted or simplified.

Embodiment 1

Figure 1B:
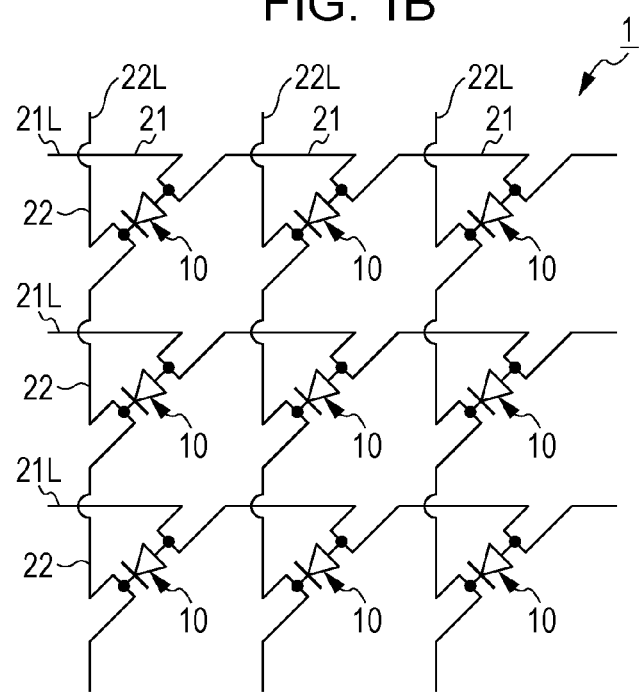
FIG. 1B is an electric circuit diagram of the light emitting device according to embodiment 1.

First, a light emitting device 1 according to embodiment 1 is described using FIG. 1A and FIG. 1B. FIG. 1A is a schematic view showing the configuration of the light emitting device according to embodiment 1. FIG. 1B is an electric circuit diagram of the light emitting device according to embodiment 1. It should be noted that, in FIG. 1A, only a partial configuration is shown with regard to LED chips 10.

As shown in FIG. 1A, the light emitting device 1 is a cloth-like display device that has overall flexibility, and is provided with a plurality of LED chips 10 that constitute an LED array made up of a plurality of LED chips, and are arranged in a matrix, and wiring 20 that links two adjacent LED chips 10 and also electrically connects electrodes of the two adjacent LED chips 10. The details are described later; however, the wiring 20 passes through through-holes in the LED chips 10 and is connected to the electrodes of the LED chips 10.

In the present embodiment, the wiring 20 is configured from a plurality of first wirings 21 and a plurality of second wirings 22. The plurality of first wirings 21 are provided continuously in the row direction through the LED chips 10.

Meanwhile, the plurality of second wirings 22 are provided continuously in the column direction through the LED chips 10.

Each of the plurality of first wirings 21 electrically connects an electrode of one LED chip 10 from among two LED chips 10 that are adjacent in the row direction, and an electrode of the other LED chip 10. Meanwhile, each of the plurality of second wirings 22 electrically connects an electrode of one LED chip 10 from among two LED chips 10 that are adjacent in the column direction, and an electrode of the other LED chip 10.

In this way, the first wiring 21 and the second wiring 22 are provided in plurality for each two LED chips 10 that are adjacent. In other words, the light emitting device 1 is configured with two mutually adjacent LED chips 10 being connected by a plurality of first wirings 21 and a plurality of second wirings 22. That is, the first wirings 21 and the LED chips 10 are alternately provided in the row direction, and the second wirings 22 and the LED chips 10 are alternately provided in the column direction.

The plurality of first wirings 21 connected in one row direction through the LED chips 10 is configured as one scanning line (anode wiring) 21L. Furthermore, the plurality of second wiring 22 connected in one column direction through the LED chips 10 is configured as one data line (cathode wiring) 22L. The scanning lines 21L and the data lines 22L are each provided in plurality as a scanning line group and a data line group.

It should be noted that although the scanning lines are anode wiring and the data lines are cathode wiring in the present embodiment, conversely, the scanning lines may be cathode wiring and the data lines may be anode wiring. It is possible for this kind of modification to likewise be applied also in all of the embodiments mentioned hereinafter.

As shown in FIG. 1B, in the present embodiment, with regard to the plurality of LED chips 10 arranged in the row direction, the anodes of adjacent LED chips 10 are sequentially connected by the first wiring 21. Furthermore, with regard to the LED chips 10 arranged in the column direction, the cathodes of adjacent LED chips 10 are sequentially connected by the second wiring 22.

The first wiring 21 and the second wiring 22 consist of a conductive wire material (wire), and, for example, are metal wiring formed from a metal such as gold (Au), silver (Au), or copper (Cu). In the present embodiment, the first wiring 21 and the second wiring 22 are copper electric wiring.

It should be noted that the first wiring 21 and the second wiring 22 may have flexibility and elasticity as well as being conductive. In this case, it is possible to use graphene such as graphite or carbon nanotubes as the material for the first wiring 21 and the second wiring 22. Thus, it is possible to alleviate the load on the first wiring 21 and the second wiring 22 that occurs when the light emitting device 1 is flexed.

Figure 2:
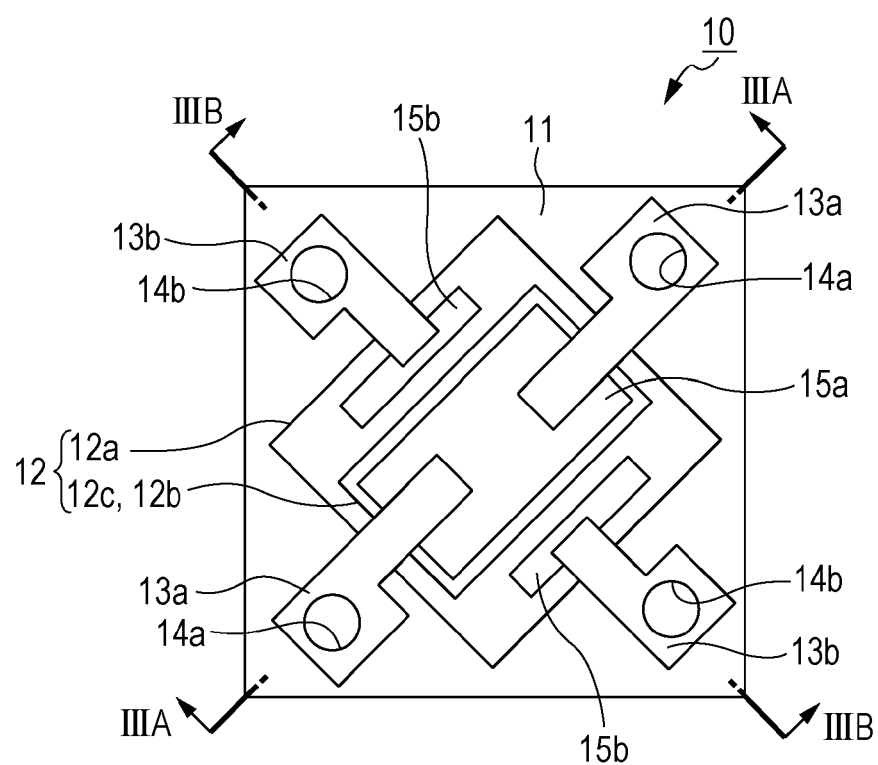
FIG. 2 is a plan view of an LED chip in the light emitting device according to embodiment 1.
Figure 3A:
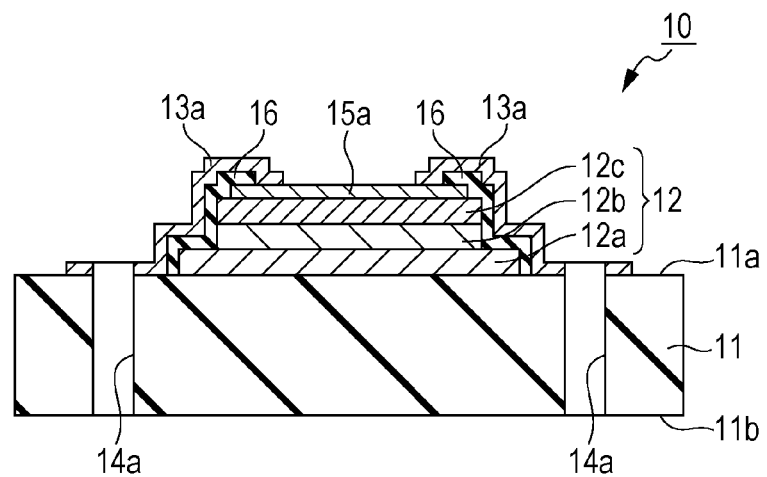
FIG. 3A is a cross-sectional view of the LED chip of FIG. 2, taken along a line IIIA-IIIA.
Figure 3B:
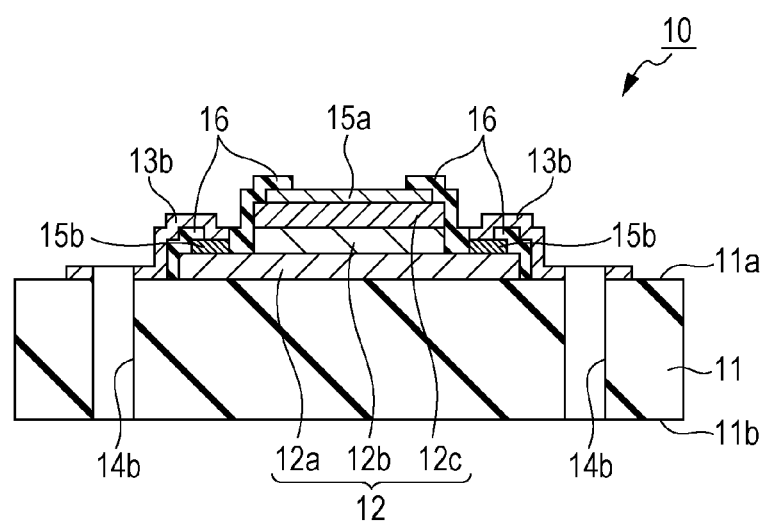
FIG. 3B is a cross-sectional view of the LED chip of FIG. 2, taken along a line IIIB-IIIB.

Next, the detailed structure of each LED chip 10 in the light emitting device 1 is described using FIG. 2, FIG. 3A, and FIG. 3B. FIG. 2 is a plan view of an LED chip in the light emitting device according to embodiment 1. FIG. 3A is a cross-sectional view of FIG. 2, taken along a line IIIA-IIIA. FIG. 3B is a cross-sectional view of FIG. 2, taken along a line IIIB-IIIB. It should be noted that an insulator 16 is not shown in FIG. 2.

As shown in FIG. 2, FIG. 3A, and FIG. 3B, each LED chip 10 has a substrate 11, a light emitting region 12 formed on the substrate 11, first pad electrodes 13a and second pad electrodes 13b formed on the substrate 11, and first through-holes 14a and second through-holes 14b passing through the substrate 11. In addition, the LED chips 10 have a p-side electrode 15a and n-side electrodes 15b, and also an insulator 16.

As shown in FIG. 3A and FIG. 3B, the substrate 11 has a first principle surface 11a (front side surface) that is the surface on which the light emitting region 12 is formed, and a second principle surface 11b (back side surface) that is the surface on the opposite side to the first principle surface 11a.

As an example, the substrate 11 is an insulative substrate or a conductive substrate. It is possible to use a sapphire substrate or the like as an insulative substrate. Furthermore, it is possible to use a semiconductor substrate such as a GaN substrate as a conductive substrate. In the present embodiment, a sapphire substrate having a rectangular shape in plan view is used as the substrate 11. Furthermore, it is possible for the size of the substrate 11 to be, for example, a 1-mm vertical by 1-mm horizontal square when seen in plan view from above.

The light emitting region 12 is a laminated structure having a plurality of semiconductor layers, and, as shown in FIG. 3A and FIG. 3B, is configured from an n-type semiconductor layer 12a, an active layer (light emitting layer) 12b, and a p-type semiconductor layer 12c, for example. In the present embodiment, the n-type semiconductor layer 12a, the active layer (light emitting layer) 12b, and the p-type semiconductor layer 12c are sequentially formed from bottom to top on the first principle surface 11a of the substrate 11. The material for each semiconductor layer may be appropriately selected in accordance with the wavelength of the light emitted by the active layer 12b, and, for example, GaAs and GaN compound semiconductors are used.

Furthermore, as shown in FIG. 2, in plan view, the n-type semiconductor layer 12a is formed large in such a way as to protrude from the active layer 12b and the p-type semiconductor layer 12c. These protruding regions are n-side electrode forming regions for forming the n-side electrodes 15b.

The first pad electrodes 13a are p-side extraction electrodes (connection electrodes) that are connected to the p-side electrode 15a. In the present embodiment, the first wiring 21 is connected to the first pad electrodes 13a.

As shown in FIG. 2 and FIG. 3A, the first pad electrodes 13a are formed along the side surface of the light emitting region 12 with the insulator 16 therebetween, from the p-side electrode 15a provided at the top of the light emitting region 12 (laminated structure) to the surface of the first principle surface 11a of the substrate 11. In the present embodiment, two first pad electrodes 13a are formed in such a way as to oppose one another with the light emitting region 12 in the center thereof.

The second pad electrodes 13b are n-side extraction electrodes (connection electrodes) that are connected to the n-side electrodes 15b. In the present embodiment, the second wiring 22 is connected to the second pad electrodes 13b.

As shown in FIG. 2 and FIG. 3B, the second pad electrodes 13b are formed along the side surface of the light emitting region 12 with the insulator 16 therebetween, from the n-side electrodes 15b provided in the n-side electrode forming regions of the n-type semiconductor layer 12a to the surface of the first principle surface 11a of the substrate 11. In the present embodiment, two second pad electrodes 13b are formed in such a way as to oppose one another with the light emitting region 12 in the center thereof.

The first through-holes 14a (via holes) are provided in such a way as to penetrate the substrate 11 from the first principle surface 11a to the second principle surface 11b. In the present embodiment, the first through-holes 14a are provided in such a way as to penetrate the first pad electrodes 13a together with the substrate 11.

Likewise, second through-holes 14b (via holes) are also provided in such a way as to penetrate the substrate 11 from the first principle surface 11a to the second principle surface 11b. In the present embodiment, the second through-holes 14b penetrate the second pad electrodes 13b together with the substrate 11.

Specifically, two of each of the first through-holes 14a and the second through-holes 14b are provided, and the through-holes are provided in corner portions (opposite corners) of the substrate 11. In this way, it is possible for the light emitting region 12 to be formed large by providing the first through-holes 14a and the second through-holes 14b in the corner portions of the substrate 11. Thus, it is possible to make the light emission area of the LED chips 10 large.

It should be noted that the pore diameters of the first through-holes 14a and the second through-holes 14b are 100 m, for example, and all have the same shape and size.

The p-side electrode 15a is formed on the p-type semiconductor layer 12c. Furthermore, the n-side electrodes 15b are formed in the n-side electrode forming regions of the n-type semiconductor layer 12a, and, as shown in FIG. 2, the two n-side electrodes 15b are formed in an opposing manner with the active layer 12b and the p-type semiconductor layer 12c therebetween.

The insulator 16 is formed in such a way as to cover the front surface of the laminated structure of the n-type semiconductor layer 12a, the active layer 12b, and the p-type semiconductor layer 12c. Furthermore, the insulator 16 is also formed on the front surfaces of the p-side electrode 15a and the n-side electrodes 15b; however, the insulator 16 is not formed on the connection portions between the p-side electrode 15a and the first pad electrodes 13a or the connection portions between the n-side electrodes 15b and the second pad electrodes 13b.

In the LED chips 10 that are configured in this way, as a result of a predetermined voltage being applied between the p-side electrode 15a and the n-side electrodes 15b, current flows to the light emitting region 12 and light is emitted.

It should be noted that, in the present embodiment, the first through-holes 14a and the second through-holes 14b are provided in such a way as to penetrate the first pad electrodes 13a and the second pad electrodes 13b; however, the present disclosure is not restricted to this. That is, the first through-holes 14a and the second through-holes 14b may be provided in such a way as to penetrate at least the substrate 11, and the first through-holes 14a and the second through-holes 14b and also the first pad electrodes 13a and the second pad electrodes 13b may be provided in different positions in the substrate 11.

Furthermore, the first through-holes 14a and the second through-holes 14b may be provided in such a way as to penetrate the light emitting region 12 (semiconductor layer). However, in this case, an insulator may be formed on the inner surface of each of the first through-holes 14a and the second through-holes 14b in order to ensure insulation between the first wiring 21 and the second wiring 22, and the first through-holes 14a and the second through-holes 14b.

Figure 4A:
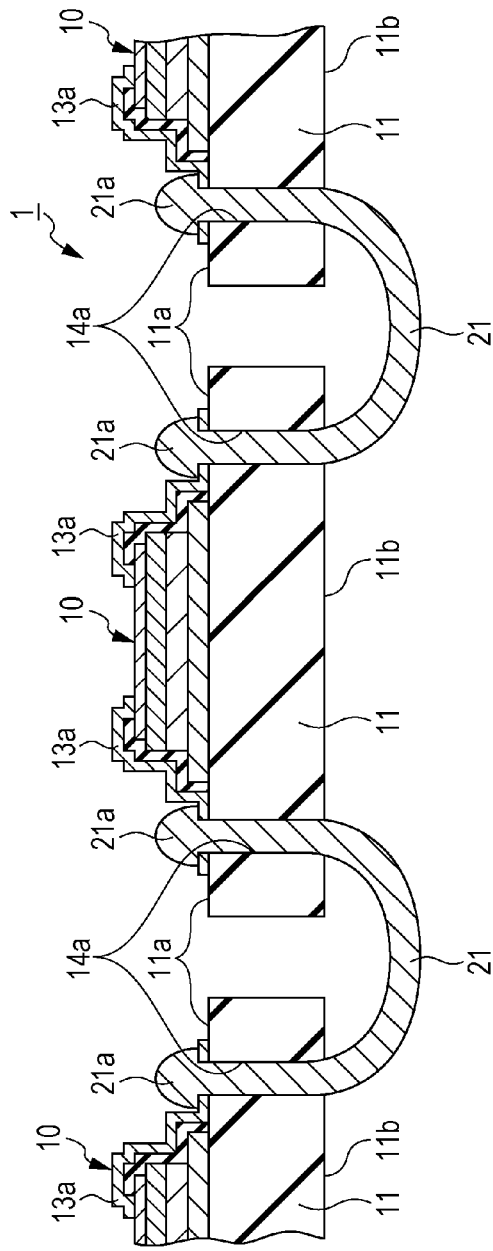
FIG. 4A illustrates the connection relationship between LED chips and first wiring in the light emitting device according to embodiment 1.
Figure 4B:
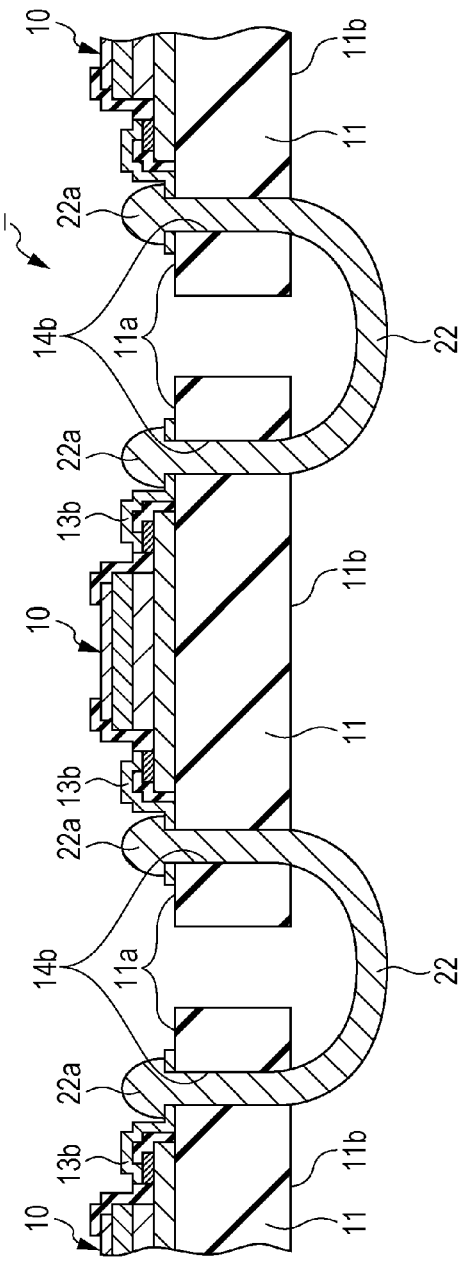
FIG. 4B illustrates the connection relationship between LED chips and second wiring in the light emitting device according to embodiment 1.

Next, the connection relationship between the LED chips 10 and the wiring 20 (first wiring 21, second wiring 22) in the light emitting device 1 is described using FIG. 4A and FIG. 4B. FIG. 4A illustrates the connection relationship between the LED chips and the first wiring in the light emitting device according to embodiment 1, and FIG. 4B illustrates the connection relationship between the LED chips and the second wiring in the light emitting device according to embodiment 1.

As shown in FIG. 4A, the first wiring 21 passes through a first through-hole 14a of one LED chip 10 from among two adjacent LED chips 10 and a first through-hole 14a of the other LED chip 10, and electrically connects to a first pad electrode 13a of the one LED chip 10 and to a first pad electrode 13a of the other LED chip 10.

The portions of the first wiring 21 that are connected to the first pad electrodes 13a are tip-end parts 21a of the first wiring 21, and the tip-end parts 21a are formed in a predetermined shape by processing the tip ends of the first wiring 21 that have passed through the first through-holes 14a. In the present embodiment, the tip-end parts 21a of the first wiring 21 are present at the first principle surface 11a side of the substrate 11.

Furthermore, the tip-end parts 21a of the first wiring 21 have, at a cross section when cut at a plane that is level with the first principle surface 11a or the second principle surface 11b of the substrate 11, a larger cross-sectional area than the cross-sectional area of the first wiring 21 inside the first through-holes 14a. That is, in plan view, the tip-end parts 21a of the first wiring 21 have an external diameter that is larger than the pore diameter of the first through-holes 14a. Specifically, the tip-end parts 21a of the first wiring 21 are substantially hemispherical, and are formed in such a way as to cover the openings of the first through-holes 14a.

Likewise, as shown in FIG. 4B, the second wiring 22 passes through a second through-hole 14b of one LED chip 10 from among two adjacent LED chips 10 and a second through-hole 14b of the other LED chip 10, and electrically connects to a second pad electrode 13b of the one LED chip 10 and to a second pad electrode 13b of the other LED chip 10.

The portions of the second wiring 22 that are connected to the second pad electrodes 13b are tip-end parts 22a of the second wiring 22, and the tip-end parts 22a are formed in a predetermined shape by processing the tip ends of the second wiring 22 that have passed through the second through-holes 14b. In the present embodiment, the tip-end parts 22a of the second wiring 22 are present at the first principle surface 11a side of the substrate 11.

Furthermore, the tip-end parts 22a of the second wiring 22 have, at a cross section when cut at a plane that is level with the first principle surface 11a or the second principle surface 11b of the substrate 11, a larger cross-sectional area than the cross-sectional area of the second wiring 22 inside the second through-holes 14b. That is, in plan view, the tip-end parts 22a of the second wiring 22 have an external diameter that is larger than the pore diameter of the second through-holes 14b. Specifically, the tip-end parts 22a of the second wiring 22 are substantially hemispherical, and are formed in such a way as to cover the openings of the second through-holes 14b.

In this way, in the present embodiment, the tip-end parts 21a of the first wiring 21 and the tip-end parts 22a of the second wiring 22 are both present at the first principle surface 11a side of the substrate 11.

It should be noted that, in embodiment 1, as shown in FIG. 4A and FIG. 4B, the pore diameters of the first through-holes 14a and the wire diameters of the first wiring 21 are the same, and the cross-sectional areas of the first through-holes 14a and the cross-sectional areas of the first wiring 21 are the same. Furthermore, the pore diameters of the second through-holes 14b and the wire diameters of the second wiring 22 are the same, and the cross-sectional areas of the second through-holes 14b and the cross-sectional areas of the second wiring 22 are the same. However, the present disclosure is not restricted to this mode, and the cross-sectional areas of the first through-holes 14a may be larger than the cross-sectional areas of the first wiring 21 inside the first through-holes 14a. Likewise, the cross-sectional areas of the second through-holes 14b may be larger than the cross-sectional areas of the second wiring 22 inside the second through-holes 14b. It should be noted that these may likewise be applied also in all of the embodiments mentioned hereinafter, not only in the present embodiment 1.

With this kind of configuration, if the light emitting device 1 is flexed, the first wiring 21 and the second wiring 22 are able to have a degree of flexibility because a space (gap) is created inside the first through-holes 14a and the second through-holes 14b. Therefore, it is possible to reduce the possibility of the first wiring 21 and the second wiring 22 breaking at the opening ends of the first through-holes 14a and the second through-holes 14b. Furthermore, if the light emitting device 1 is flexed, it is possible to alleviate the bent state of the first wiring 21 and the second wiring 22 that curve, and it is therefore possible to reduce the bending stress load that is applied to the first wiring 21 and the second wiring 22.

Next, the method for connecting the LED chip 10 and the first wiring 21 and the second wiring 22 is described.

First, U-shaped conductive wire materials having the same wire diameter are prepared as the first wiring 21 and the second wiring 22, and this U-shaped first wiring 21 and second wiring 22 is inserted through the first through-holes 14a and the second through-holes 14b.

Specifically, the tip ends of the U-shaped first wiring 21 are introduced into a first through-hole 14a of one LED chip 10 from among two adjacent LED chips 10 and a first through-hole 14a of the other LED chip 10 from the second principle surface 11b side of the substrate 11, and are inserted through the first through-holes 14a.

Specifically, the tip ends of the U-shaped second wiring 22 are introduced into a second through-hole 14b of one LED chip 10 from among two adjacent LED chips 10 and a second through-hole 14b of the other LED chip 10 from the second principle surface 11b side of the substrate 11, and are inserted through the second through-holes 14b.

Thereafter, the tip ends of the first wiring 21 and the second wiring 22 of the portions that have passed through the first through-holes 14a and the second through-holes 14b are welded by a discharge welding apparatus or the like, and, as shown in FIG. 4A and FIG. 4B, each of the tip ends of the first wiring 21 and the second wiring 22 is thereby processed into the substantially hemispherical tip-end parts 21a and tip-end parts 22a.

Thus, it is possible to connect the first pad electrodes 13a of two adjacent LED chips 10 and the first wiring 21, and also to prevent the first wiring 21 from detaching from the first through-holes 14a such that the first wiring 21 and the two LED chips 10 are linked and fixed. Likewise, it is possible to connect the second pad electrodes 13b of two adjacent LED chips 10 and the second wiring 22, and also to prevent the second wiring 22 from detaching from the second through-holes 14b such that the second wiring 22 and the two LED chips 10 are linked and fixed.

As described above, according to the light emitting device 1 according to the present embodiment, the wiring 20 (first wiring 21 and second wiring 22) passes through the through-holes (first through-holes 14a and second through-holes 14b) of the substrate 11, and is connected to the electrodes (first pad electrodes 13a, second pad electrodes 13b) of the LED chips 10.

Thus, the movement range of the wiring 20 is limited, and it is therefore possible to suppress the load applied to connection portions between the wiring 20 and the electrodes of the LED chips 10. Therefore, it is possible to reduce the occurrence of defects in electrical continuity and the like in the connection portions even when the light emitting device 1 is flexed in such a way as to be curved.

In addition, according to the light emitting device 1 in the present embodiment, the tip-end parts 21a of the first wiring 21 that have passed through the first through-holes 14a have, at a cross section when cut at a plane that is parallel with the first principle surface 11a or the second principle surface 11b of the substrate 11, a larger cross-sectional area than the cross-sectional area of the first wiring 21 inside the first through-holes 14a. Furthermore, the tip-end parts 22a of the second wiring 22 that have passed through the second through-holes 14b have a cross-sectional area that is larger than the cross-sectional area of the second wiring 22 inside the second through-holes 14b.

Thus, it is possible, for each LED chip 10, to link and fix the first wiring 21 or the second wiring 22 and the LED chip 10 without the wiring detaching from the through-holes, and it is therefore possible to use the first wiring 21 and the second wiring 22 to easily link the plurality of LED chips 10 even when the first wiring 21 and the second wiring 22 are a thin wire material.

Furthermore, in the light emitting device 1 in the present embodiment, the first wiring 21 and the second wiring 22 are provided in plurality for each two adjacent LED chips 10. Specifically, the first wiring 21 and the second wiring 22 are provided in an alternating manner with LED chips 10 in the row direction and the column direction, respectively.

Figure 39:
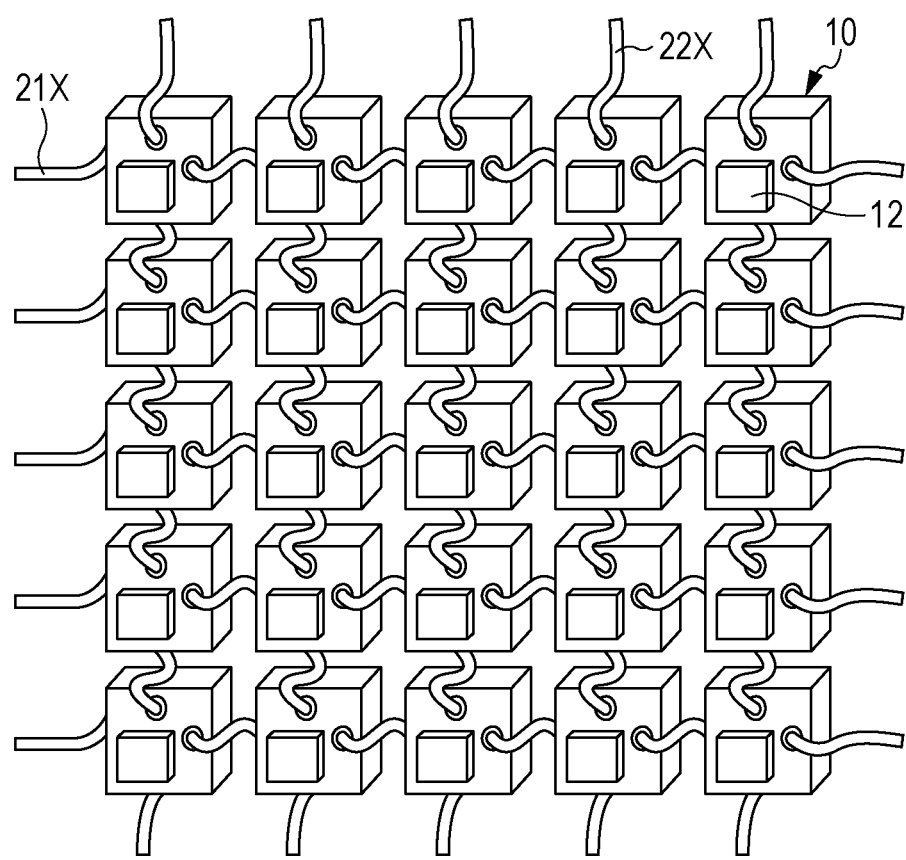
FIG. 39 is a schematic view showing the configuration of a light emitting device of a comparative example.

Thus, it is possible for the plurality of LED chips 10 to be easily linked compared to when, as shown in FIG. 39, the plurality of LED chips 10 are linked with a single wire 21X (or 22X) continuously passing through the through-holes of the LED chips 10 from top to bottom in an alternating manner as if weaving a piece of cloth with a thread.

Furthermore, in the present embodiment, the thickness of the portions of the first wiring 21 and the second wiring 22 that are exposed at the second principle surface 11b side of the substrate 11 may be thicker than the portions of the first wiring 21 and the second wiring 22 that are inside the through-holes. For example, the wire diameter of the portions of the first wiring 21 and the second wiring 22 that are exposed at the second principle surface 11b side of the substrate 11 may be larger than the wire diameter of the portions of the first wiring 21 and the second wiring 22 that are inside the through-holes.

Thus, it is possible to improve the mechanical strength of the first wiring 21 and the second wiring 22, and it is therefore possible to alleviate the load on the first wiring 21 and the second wiring 22 that occurs when the light emitting device 1 is flexed.

Figure 5:
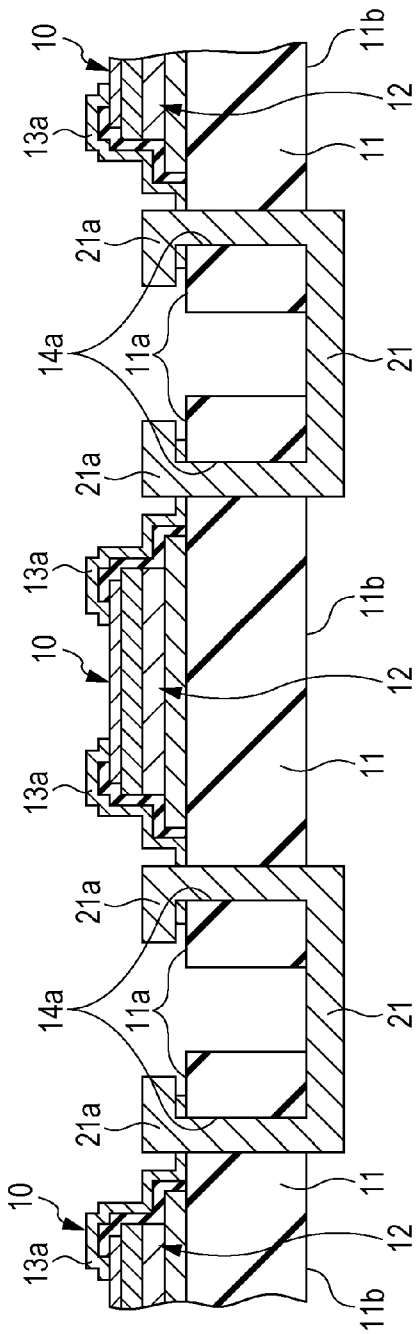
FIG. 5 illustrates the connection relationship between LED chips and first wiring in a light emitting device according to modified example 1 of embodiment 1.

Furthermore, the U-shape of the first wiring 21 and the second wiring 22 may be made more angular. In this case, the tip ends of the first wiring 21 and the second wiring 22 that have passed through the first through-holes 14a and the second through-holes 14b may be welded to thereby form the tip-end parts 21a and 22a. Furthermore, as shown in FIG. 5, the tip ends of the first wiring 21 that have passed through the first through-holes 14a may be bent along the surface of the first principle surface 11a of the substrate 11.

Specifically, for example, the tip ends of the U-shaped first wiring 21 are introduced into the first through-holes 14a from the second principle surface 11b side of the substrate 11, and are passed through the first through-holes 14a. Thereafter, the tip-end portions of the first wiring 21 that have passed through the first through-holes 14a are bent at an angle of 90 degrees, for example. Thus, as shown in FIG. 5, it is possible to form first wiring 21 in which the tip-end parts 21a are bent in an L-shape.

In this case also, it is possible to connect the first pad electrodes 13a of two adjacent LED chips 10 and the first wiring 21, and also to prevent the first wiring 21 from detaching from the first through-holes 14a such that the first wiring 21 and the two LED chips 10 are linked and fixed.

Furthermore, by bending the tip ends of the first wiring 21 and the second wiring 22, it is possible to realize electrical connections and a structure that prevents falling from the through-holes, and it is possible for the plurality of LED chips 10 to be easily linked.

In addition, in FIG. 5, the tip ends of the first wiring 21 are bent toward the outside of the substrates 11. Thus, it is possible to easily avoid the bent tip-end parts 21a of the first wiring 21 from coming into contact with the light emitting region 12.

It should be noted that the bent tip ends of the first wiring 21 may protrude from the substrates 11, and also may not protrude from the substrates 11. Furthermore, although the first wiring 21 has been illustrated in FIG. 5, it is also possible to employ the same configuration for the second wiring 22.

Figure 6:
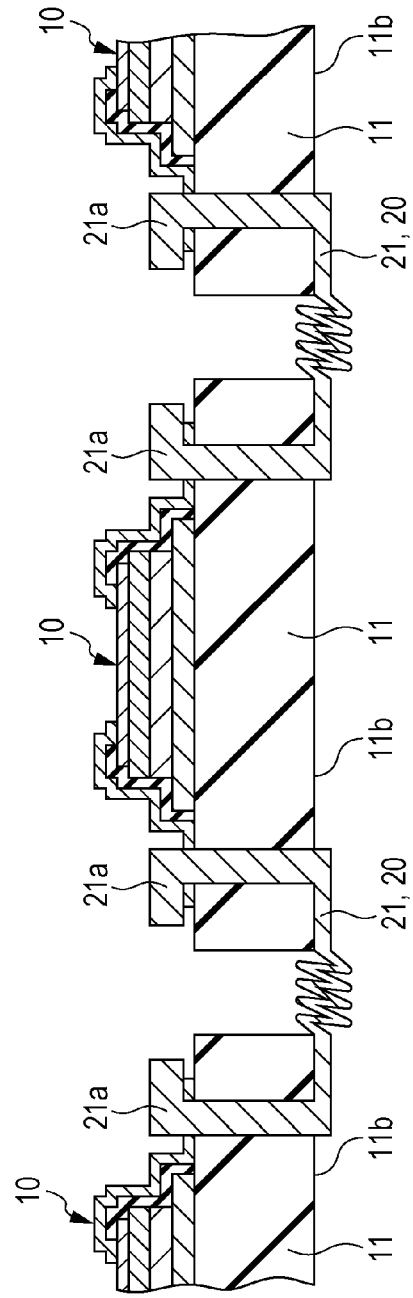
FIG. 6 illustrates the connection relationship between LED chips and first wiring in a light emitting device according to modified example 2 of embodiment 1.

Furthermore, as shown in FIG. 6, the wiring 20 may have a stretchable structure between two adjacent LED chips 10. For example, a stretchable structure such as a meander structure or a spring structure may be provided at the portion of the first wiring 21 that is exposed at the second principle surface 11b side of the substrate 11.

By providing a stretchable structure in part of the wiring 20 in this way, it is possible for the bending stress (load) of the wiring 20 that occurs when the light emitting device 1 is flexed to be absorbed by the wiring structure. That is, it is possible for the bending stress to be alleviated as result of the wiring 20 itself stretching.

It should be noted that, although the first wiring 21 has been illustrated in FIG. 6, it is also possible to employ the same configuration for the second wiring 22.

Figure 7A:
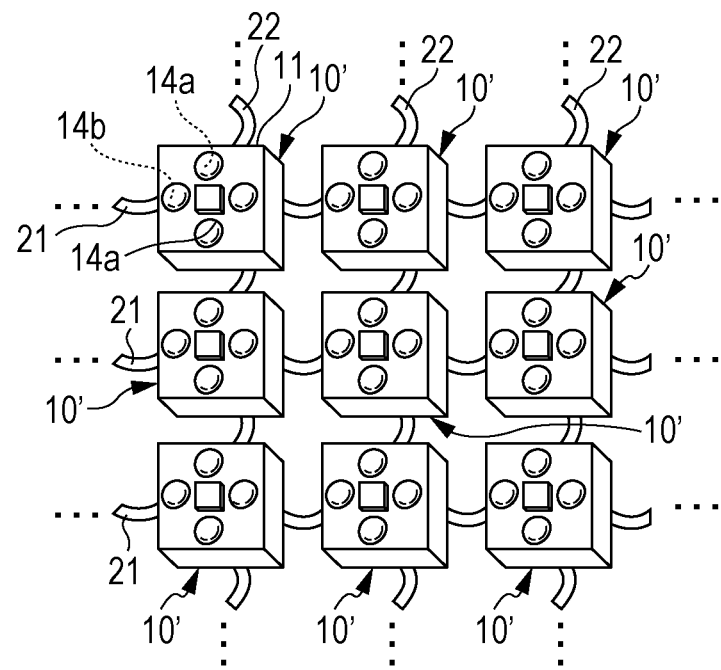
FIG. 7A is a schematic view showing the configuration of a light emitting device according to modified example 3 of embodiment 1.
Figure 7B:
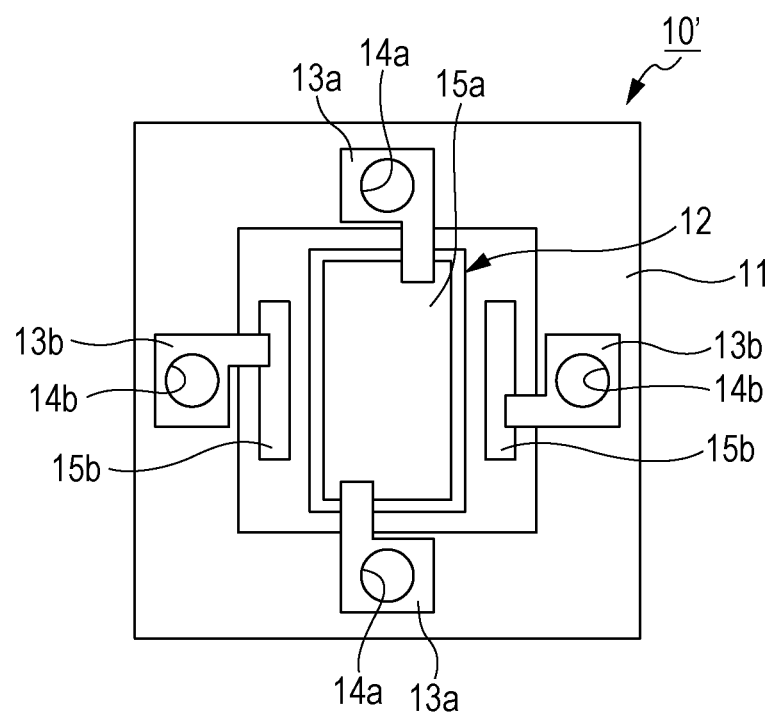
FIG. 7B is a plan view of an LED chip in the light emitting device according to modified example 3 of embodiment 1.

Furthermore, in the present embodiment, as shown in FIG. 1A, the first through-holes 14a and the second through-holes 14b are provided in corner portions (opposite corners) of the substrate 11; however, the present disclosure is not restricted to this. For example, as shown in FIG. 7A and FIG. 7B, LED chips 10' in which the first through-holes 14a and the second through-holes 14b are provided at four sides (opposite sides) of the substrate 11 may be arranged in a matrix, and two adjacent LED chips 10' may be connected by the first wiring 21 and the second wiring 22. It should be noted that, as shown in FIG. 7B, in the LED chips 10', the first pad electrodes 13a and the second pad electrodes 13b are also formed in such a way as to extend toward the four sides (opposite sides) of the substrate 11.

Thus, as shown in FIG. 7A, it is possible for the LED chips 10 to be arranged in such a way that the sides of the substrates 11 of adjacent LED chips 10 face each other. As a result, it is possible for the arrangement pitch of the LED chips 10 to be made smaller compared to when the LED chips 10 are arranged in such a way that the corners of the substrates 11 of adjacent LED chips 10 face each other, as shown in FIG. 1A. It is therefore possible to realize a light emitting device in which the LED chips 10 are arranged with high density.

Figure 8:
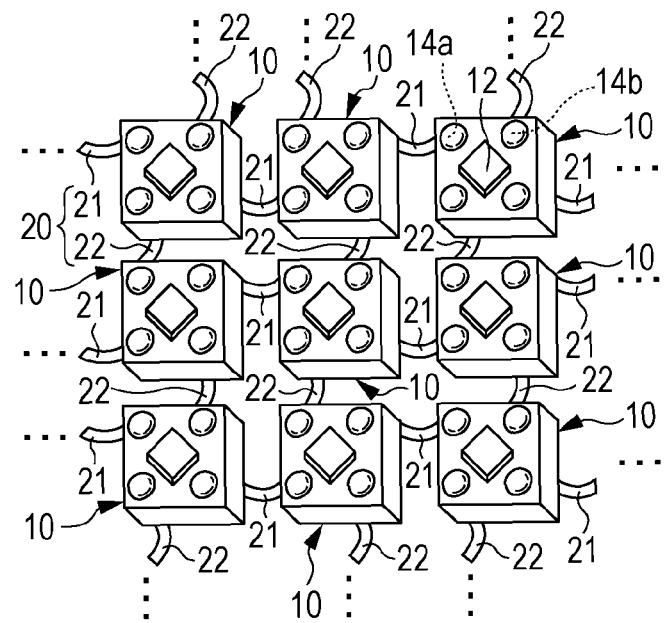
FIG. 8 is a plan view of an LED chip in a light emitting device according to modified example 4 of embodiment 1.

Furthermore, a light emitting device having a configuration such as that shown in FIG. 8 is also permissible. The light emitting device shown in FIG. 8 has a configuration in which each LED chip 10 in FIG. 1A has been rotated 45 degrees. Specifically, the directions of the LED chips 10 in FIG. 1A have been altered in such a way as to each be repeatedly rotated 45 degrees to the right and rotated 45 degrees to the left in an alternating manner in both the row direction and the column direction.

Thus, it is possible for the LED chips 10 to be arranged in such a way that the sides of the substrates 11 of adjacent LED chips 10 face each other, and it is therefore possible for the arrangement pitch of the LED chips 10 to be made smaller.

Moreover, because the first through-holes 14a and the second through-holes 14b are provided in the corner portions (opposite corners) of the substrate 11, it is possible for the light emitting region 12 to be formed large.

Therefore, it is possible to realize a light emitting device in which the light emitting region 12 is large and the LED chips 10 are arranged with high-density.

Heretofore, embodiment 1 and modified examples thereof have been described; however, the plurality of LED chips 10 and 10' may be packaged with a resin that is more pliable (having greater flexibility) than the first wiring 21 and the second wiring 22. With this configuration, it is possible to maintain the flexibility of a display device in which a light emitting device according to the present embodiment 1 or the modified examples thereof is used, while also strengthening the links between the plurality of LED chips connected by the first wiring 21 and the second wiring 22. It should be noted that the configuration in which packaging is implemented using a resin may likewise be applied also in all of the embodiments mentioned hereinafter, not only the present embodiment 1.

Embodiment 2

Figure 9:
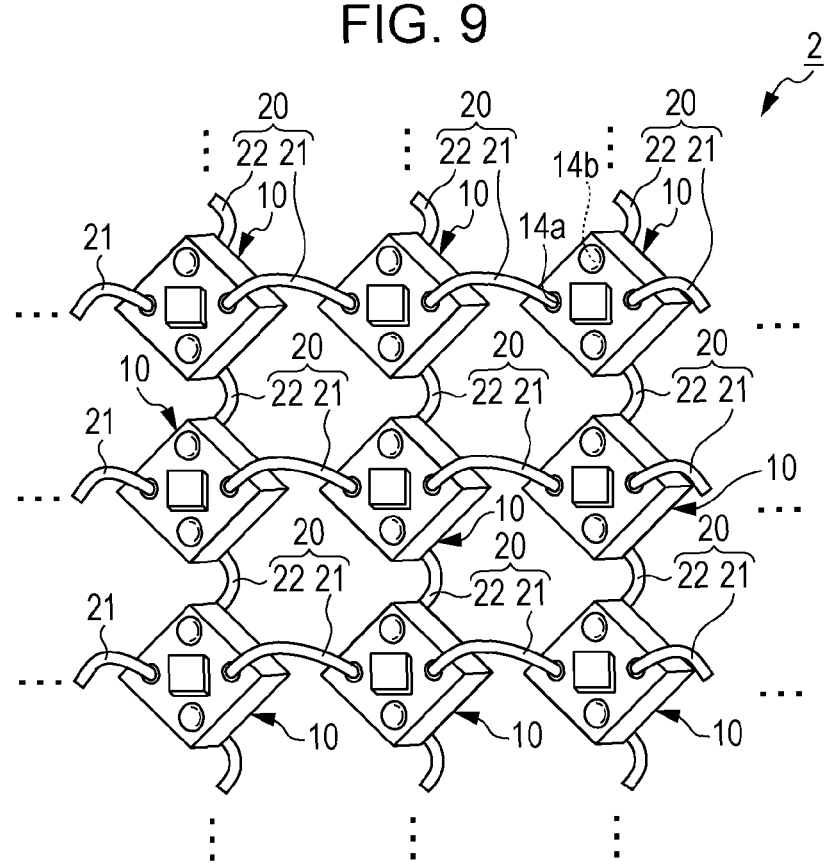
FIG. 9 is a schematic view showing the configuration of a light emitting device according to embodiment 2.

Next, a light emitting device 2 according to embodiment 2 is described using FIG. 9, FIG. 10A, and FIG. 10B. FIG. 9 is a schematic view showing the configuration of the light emitting device according to embodiment 2. FIG. 10A illustrates the connection relationship between LED chips and first wiring in the light emitting device according to embodiment 2, and FIG. 10B illustrates the connection relationship between LED chips and second wiring in the light emitting device according to embodiment 2.

As shown in FIG. 9, in the present embodiment also, the first wiring 21 and the second wiring 22 are provided alternately with LED chips 10 in such a way that two adjacent LED chips 10 are linked.

Furthermore, as shown in FIG. 10A and FIG. 10B, the first wiring 21 passes through the first through-holes 14a of two adjacent LED chips 10, and electrically connects the first pad electrodes 13a of the two adjacent LED chips 10. Likewise, the second wiring 22 passes through the second through-holes 14b of two adjacent LED chips 10, and electrically connects the second pad electrodes 13b of the two adjacent LED chips 10.

Furthermore, in the present embodiment also, the tip-end parts 21a of the first wiring 21 that have passed through the first through-holes 14a have, at a cross section when cut at a plane that is parallel with the first principle surface 11a or the second principle surface 11b of the substrate 11, a larger cross-sectional area than the cross-sectional area of the first wiring 21 inside the first through-holes 14a.

Furthermore, the tip-end parts 22a of the second wiring 22 that have passed through the second through-holes 14b have, at a cross section when cut at a plane that is parallel with the first principle surface 11a or the second principle surface 11b of the substrate 11, a larger cross-sectional area than the cross-sectional area of the second wiring 22 inside the second through-holes 14b.

The light emitting device 2 according to the present embodiment is different from the light emitting device 1 in embodiment 1 in terms of the arrangement position of the wiring 20 with respect to the LED chips 10 (substrates 11).

In other words, in embodiment 1, both of the first wiring 21 and the second wiring 22 link the LED chips 10 from the second principle surface 11b side of the substrate 11; however, in the present embodiment, the first wiring 21 links the LED chips 10 from the first principle surface 11a side (light emitting region 12 side) of the substrate 11, and the second wiring 22 links the LED chips 10 from the second principle surface 11b side of the substrate 11.

As a result, in embodiment 1, the tip-end parts 21a of the first wiring 21 are present at the first principle surface 11a of the substrate 11; however, in the present embodiment, as shown in FIG. 9 and FIG. 10A, the tip-end parts 21a of the first wiring 21 are present at the second principle surface 11b of the substrate 11.

Therefore, in the present embodiment, the insertion direction of the first wiring 21 with respect to the first through-holes 14a is different from that in embodiment 1.

Specifically, the tip ends of the U-shaped first wiring 21 are introduced into a first through-hole 14a of one LED chip 10 from among two adjacent LED chips 10 and a first through-hole 14a of the other LED chip 10 from the first principle surface 11a side of the substrate 11, and are inserted through the first through-holes 14a. Thereafter, the tip ends of the first wiring 21 of the portions that have passed through the first through-holes 14a are welded by a discharge welding apparatus or the like, and, as shown in FIG. 10A, the tip ends of the first wiring 21 are thereby processed into the substantially hemispherical tip-end parts 21a.

Thus, it is possible to prevent the first wiring 21 from detaching from the first through-holes 14a such that the first wiring 21 and the LED chips 10 are linked and fixed. Furthermore, the first wiring 21 and the first pad electrodes 13a come into contact at the first principle surface 11a of the substrate 11 and are thereby electrically connected.

It should be noted that, as shown in FIG. 10B, the connection relationship of the second wiring 22 and the LED chips 10 is the same as in embodiment 1. That is, the tip-end parts 22a of the second wiring 22 are present at the first principle surface 11a side of the substrate 11, and the second wiring 22 is connected to the LED chips 10 by the same method as in embodiment 1.

As described above, according to the light emitting device 2 according to the present embodiment, the same effect as in embodiment 1 is obtained. In other words, it is possible to suppress the load applied to connection portions between the wiring 20 and the electrodes of the LED chips 10, and it is possible to reduce the occurrence of defects in electrical continuity and the like in the connection portions. Furthermore, it is possible, for each LED chip 10, to link and fix the first wiring 21 or the second wiring 22 and the LED chip 10, and it is therefore possible to easily link the plurality of LED chips 10 even when the first wiring 21 and the second wiring 22 are a thin wire material.

In addition, in the present embodiment, the adjacent LED chips 10 are linked in the row direction by inserting the first wiring 21 from the first principle surface 11a side (light emitting region 12 side) of the substrate 11, and are linked in the column direction by inserting the second wiring 22 from the second principle surface 11b side of the substrate 11.

Thus, the first wiring 21 and the second wiring 22 are positioned with the LED chips 10 (substrates 11) therebetween, and it is therefore possible to suppress short-circuiting between the first wiring 21 and the second wiring 22. In particular, if the light emitting device 2 is flexed, there is a possibility of the first wiring 21 and the second wiring 22 becoming close to each other and a short-circuit defect occurring; however, by arranging the first wiring 21 and the second wiring 22 as in the present embodiment, it is possible to avoid a short-circuit defect between the first wiring 21 and the second wiring 22 even when the light emitting device 2 is flexed.

Furthermore, in the present embodiment, the tip-end parts 21a of the first wiring 21 are present at the second principle surface 11b of the substrate 11.

Thus, it is possible to reduce damage to the light emitting region 12 when the tip ends of the first wiring 21 are processed. Furthermore, because the semiconductor layers and the like are not formed on the second principle surface 11b of the substrate 11, it is possible for the tip ends of the first wiring 21 to be easily processed.

It should be noted that, in the present embodiment, the tip-end parts 21a are formed by welding the tip ends of the first wiring 21 that have passed through the first through-holes 14a; however, the present disclosure is not restricted to this. For example, as shown in FIG. 11, the tip-end portions of the first wiring 21 that have passed through the first through-holes 14a may be bent along the surface of the second principle surface 11b of the substrate 11.

Specifically, for example, the tip ends of the U-shaped first wiring 21 are introduced into the first through-holes 14a from the first principle surface 11a of the substrate 11, and are passed through the first through-holes 14a. Thereafter, the tip-end portions of the first wiring 21 of the portions that have passed through the first through-holes 14a are bent at an angle of 90 degrees, for example. Thus, as shown in FIG. 11, it is possible to form first wiring 21 in which the tip-end parts 21a are bent in an L-shape. FIG. 11 is a drawing depicting the connection relationship between LED chips and first wiring in a light emitting device according to modified example 1 of embodiment 2.

With this configuration, it is possible to connect the first pad electrodes 13a of two adjacent LED chips 10 and the first wiring 21, and also to prevent the first wiring 21 from detaching from the first through-holes 14a such that the first wiring 21 and the two LED chips 10 are linked and fixed.

Figure 11:
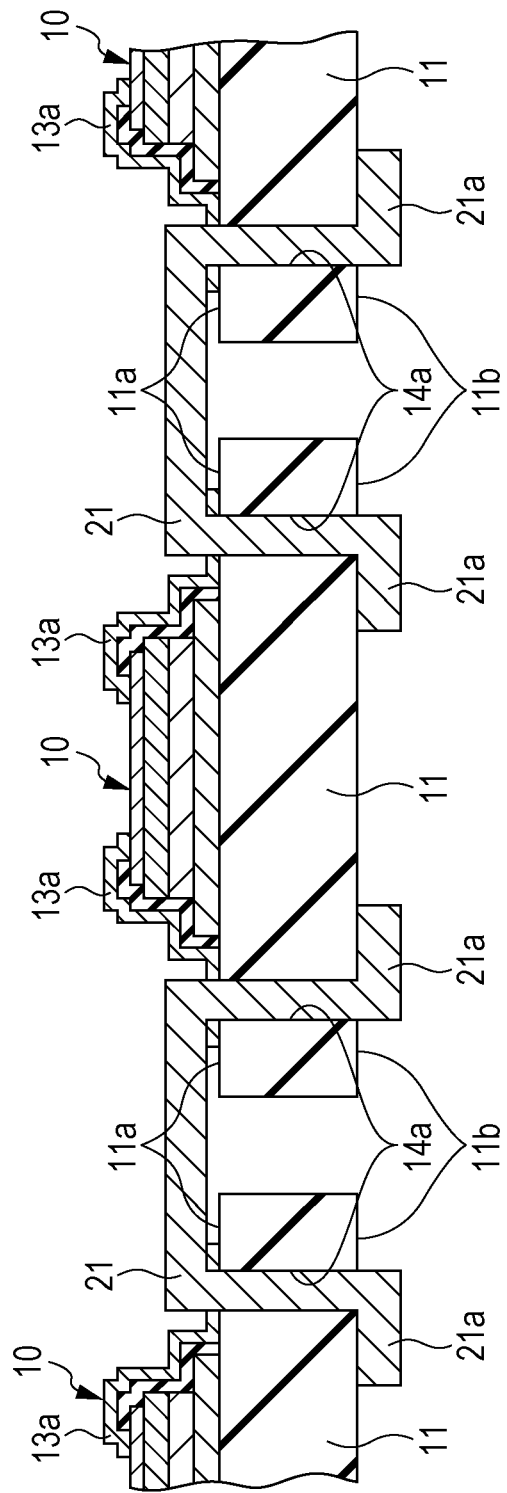
FIG. 11 illustrates the connection relationship between LED chips and first wiring in a light emitting device according to modified example 1 of embodiment 2.

In addition, in FIG. 11, the tip ends of the first wiring 21 are bent toward the inside of the substrates 11 (direction toward the center of the LED chips 10). Since there is space on the second principle surface 11b of the substrate 11 that is not provided with the light emitting region 12, it is possible to increase the length of the tip-end parts 21a of the bent portions by bending the tip ends of the first wiring 21 toward the inside of the substrates 11.

Thus, it is possible to securely fix the first wiring 21 and the LED chips 10, and it is therefore possible to further reduce defects in electrical continuity when the light emitting device is flexed.

Moreover, in FIG. 11, because the tip ends of the first wiring 21 are bent onto the second principle surface 11b of the substrate 11, it is possible to avoid the light emitting region 12 being damaged when the first wiring 21 is bent. Furthermore, by processing the tip ends of the first wiring 21 on the second principle surface 11b of the substrate 11 where the semiconductor layers and the like are not formed, it is possible for the bending processing of the first wiring 21 to be easily carried out. For example, it is possible for the bending processing to be easily carried out even when all of the first wirings 21 are bent at the same time.

It should be noted that, although the first wiring 21 has been illustrated in FIG. 11, it is also possible to employ the same configuration for the second wiring 22.

Figure 12A:
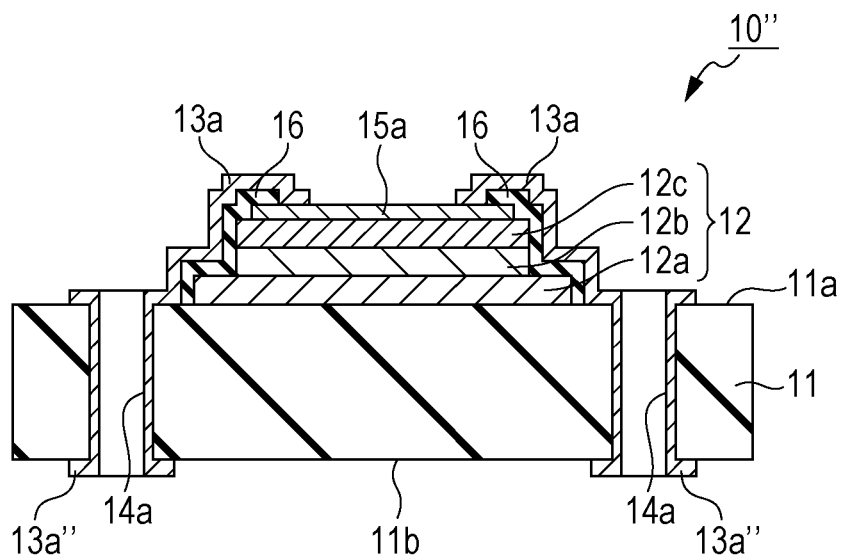
FIG. 12A is a cross-sectional view of an LED chip according to modified example 2 of embodiment 2.
Figure 12B:
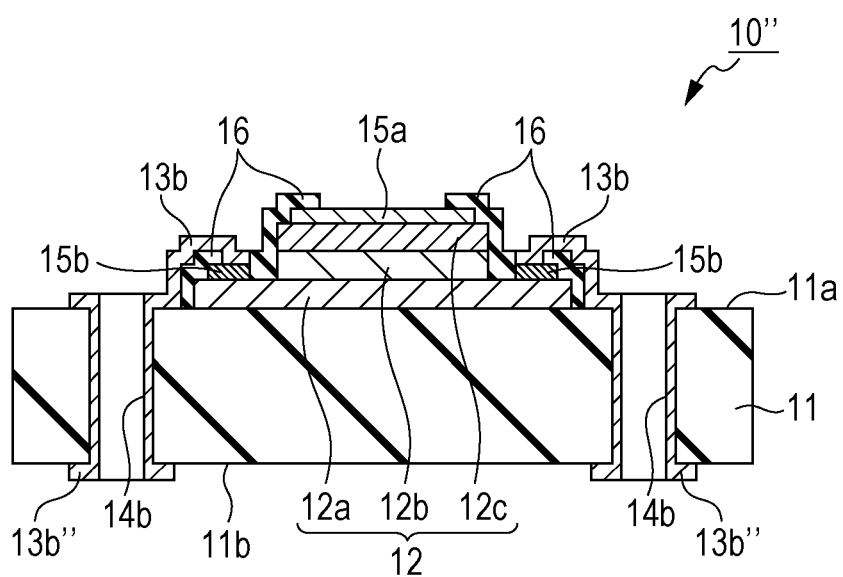
FIG. 12B is a cross-sectional view of the LED chip according to modified example 2 of embodiment 2.

Furthermore, in the light emitting device 2 in the present embodiment, the LED chip 10" shown in FIG. 12A and FIG. 12B may be used instead of the LED chip 10. FIG. 12A and FIG. 12B are cross-sectional views of an LED chip according to modified example 2 of embodiment 2, and correspond to the cross-sectional views of FIG. 3A and FIG. 3B, respectively.

As shown in FIG. 12A and FIG. 12B, the LED chip 10" has a configuration in which back face-side first pad electrodes 13a" and back face-side second pad electrodes 13b" are additionally provided in the LED chip 10 shown in FIG. 3A and FIG. 3B.

As shown in FIG. 12A, the back face-side first pad electrodes 13a" are formed on the second principle surface 11b of the substrate 11, and are electrically connected to the first pad electrodes 13a via a conductive film formed on the inner surfaces of the first through-holes 14a.

Furthermore, as shown in FIG. 12B, the back face-side second pad electrodes 13b" are formed on the second principle surface 11b of the substrate 11, and are electrically connected to the second pad electrodes 13b via a conductive film formed on the inner surfaces of the second through-holes 14b.

For example, by carrying out metal plating processing from the inner surfaces of the first through-holes 14a and the second through-holes 14b to the second principle surface 11b side of the substrate 11, it is possible to form the back face-side first pad electrodes 13a" and the back face-side second pad electrodes 13b" that are connected to the first through-holes 14a and the second through-holes 14b.

By using LED chips 10" configured in this way, if the tip-end parts 21a of the first wiring 21 are present on the second principle surface 11b of the substrate 11 as shown in FIG. 10A, it is possible to bring the tip-end parts 21a and the back face-side first pad electrodes 13a" into contact with each other. Thus, it is possible for the tip-end parts 21a and the first pad electrodes 13a to be electrically connected via the back face-side first pad electrodes 13a". It is therefore possible for the first wiring 21 and the first pad electrodes 13a to be electrically connected in a reliable manner.

It should be noted that, as in the aforementioned FIG. 10B, even when the tip-end parts 22a of the second wiring 22 are present on the first principle surface 11a of the substrate 11, by using the LED chip 10" shown in FIG. 12A and FIG. 12B, the second wiring 22 comes into contact with the second pad electrodes 13b and the back face-side second pad electrodes 13b" at two locations. It is therefore possible to further reduce the occurrence of defects in electrical continuity between the second wiring 22 and the second pad electrodes 13b. It is possible for this configuration of FIG. 10A and FIG. 10B to also be applied in other embodiments and modified examples.

Figure 13:
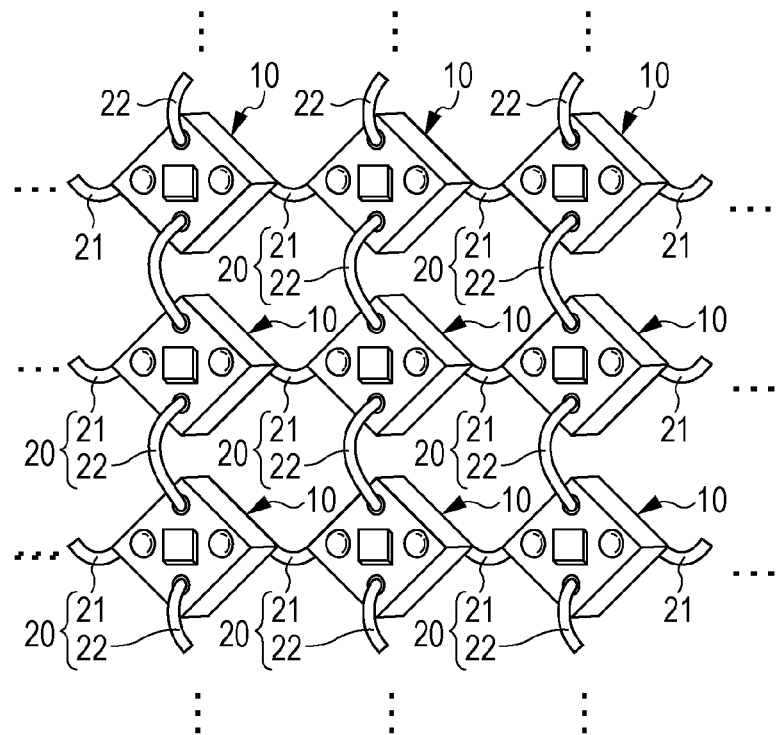
FIG. 13 is a schematic view showing the configuration of a light emitting device according to modified example 3 of embodiment 2.

Furthermore, in the light emitting device 2 in the present embodiment shown in FIG. 9, the first wiring 21 is inserted from the first principle surface 11a side of the substrate 11, and the second wiring 22 is inserted from the second principle surface 11b side of the substrate 11; however, the present disclosure is not restricted to this. For example, as shown in FIG. 13, the wiring 20 and the LED chips 10 may be linked by inserting the first wiring 21 from the second principle surface 11b side of the substrate 11, and inserting the second wiring 22 from the first principle surface 11a side of the substrate 11.

Embodiment 3

Figure 14:
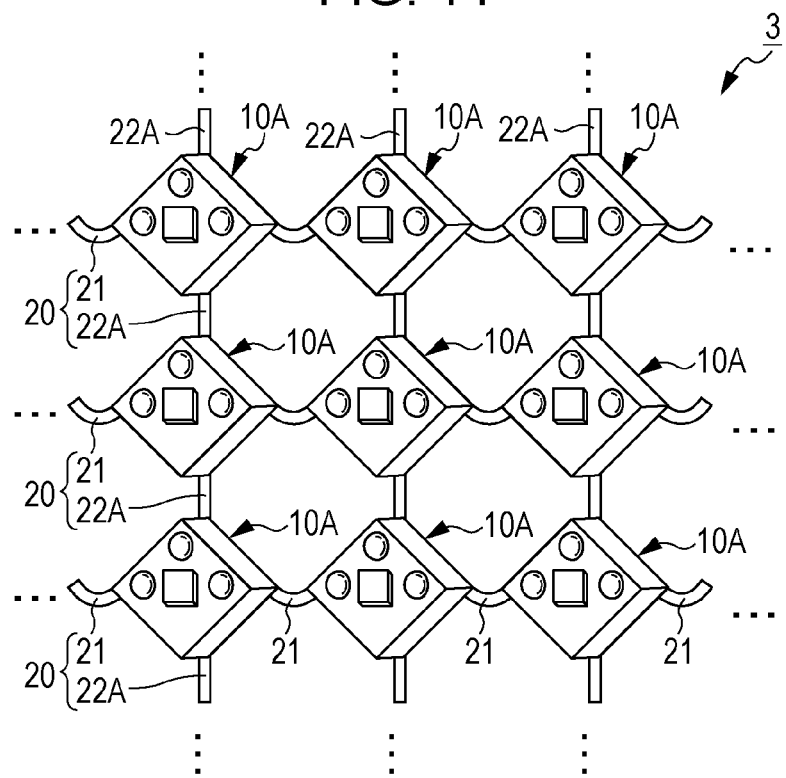
FIG. 14 is a schematic view showing the configuration of a light emitting device according to embodiment 3.

Next, a light emitting device 3 according to embodiment 3 is described. FIG. 14 is a schematic view showing the configuration of the light emitting device according to embodiment 3.

As shown in FIG. 14, the light emitting device 3 is provided with a plurality of LED chips 10A that are arranged in a matrix, and wiring 20 that links two adjacent LED chips 10A and also electrically connects electrodes of the two adjacent LED chips 10A.

In the present embodiment also, the wiring 20 passes through the through-holes in the LED chips 10A, and is connected to electrodes of the LED chips 10A. The wiring 20 is configured from a plurality of first wirings 21 and second wirings 22A. Similar to the first wiring 21, the second wiring 22A is a conductive wire material (wire).

Figure 15:
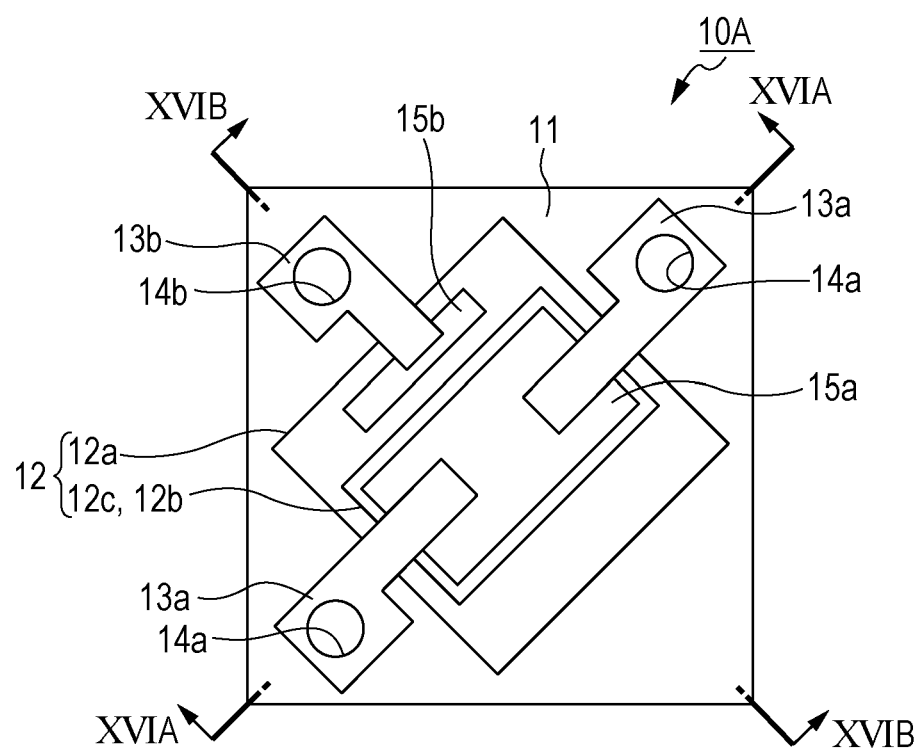
FIG. 15 is a plan view of an LED chip in the light emitting device according to embodiment 3.
Figure 16A:
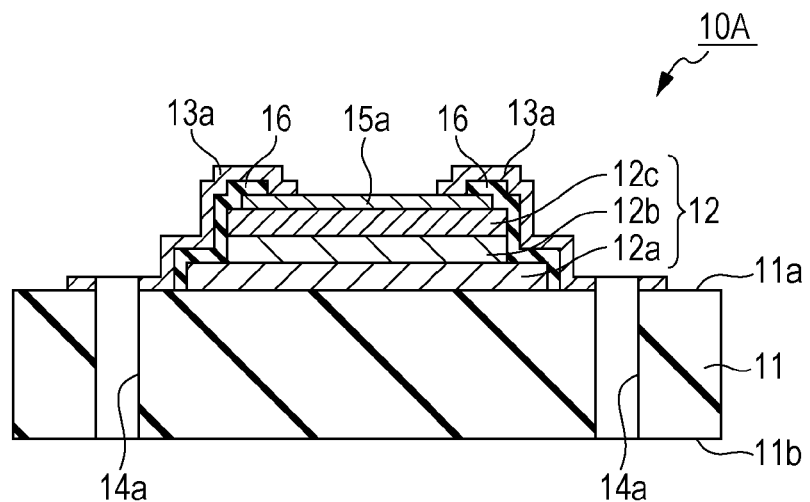
FIG. 16A is a cross-sectional view of the LED chip of FIG. 15, taken along a line XVIA-XVIA.
Figure 16B:
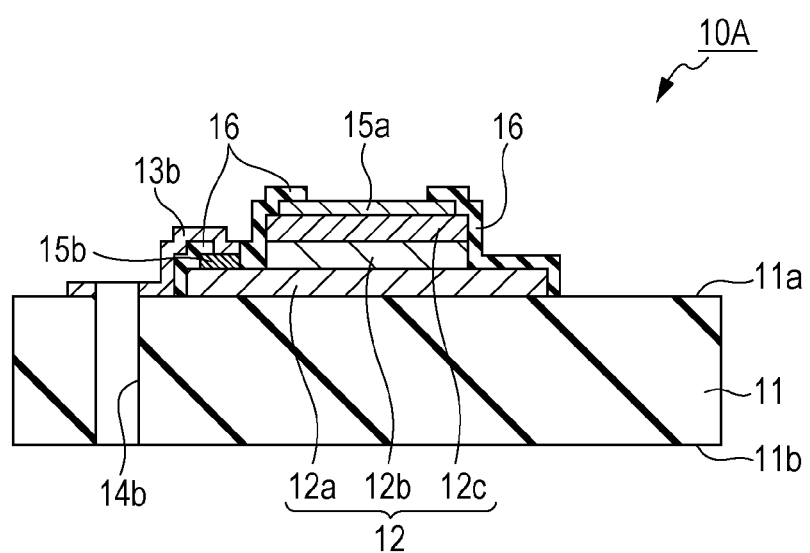
FIG. 16B is a cross-sectional view of the LED chip of FIG. 15, taken along a line XVIB-XVIB.

Next, the detailed structure of the LED chips 10A in the present embodiment is described using FIG. 15, FIG. 16A, and FIG. 16B. FIG. 15 is a plan view of an LED chip in the light emitting device according to embodiment 3. FIG. 16A is a cross-sectional view of FIG. 15, taken along a line XVIA-XVIA. FIG. 16B is a cross-sectional view of FIG. 15, taken along a line XVIB-XVIB. It should be noted that the insulator 16 is not shown in FIG. 15.

As shown in FIG. 15, FIG. 16A, and FIG. 16B, the LED chip 10A is provided with three through-holes. Specifically, two first through-holes 14a and one second through-hole 14b are provided in the substrate 11.

It should be noted that the total number of pad electrodes in the substrate 11 is also three in accordance with the total number of through-holes. Specifically, two first pad electrodes 13a and one second pad electrode 13b are provided in the substrate 11.

Figure 17:
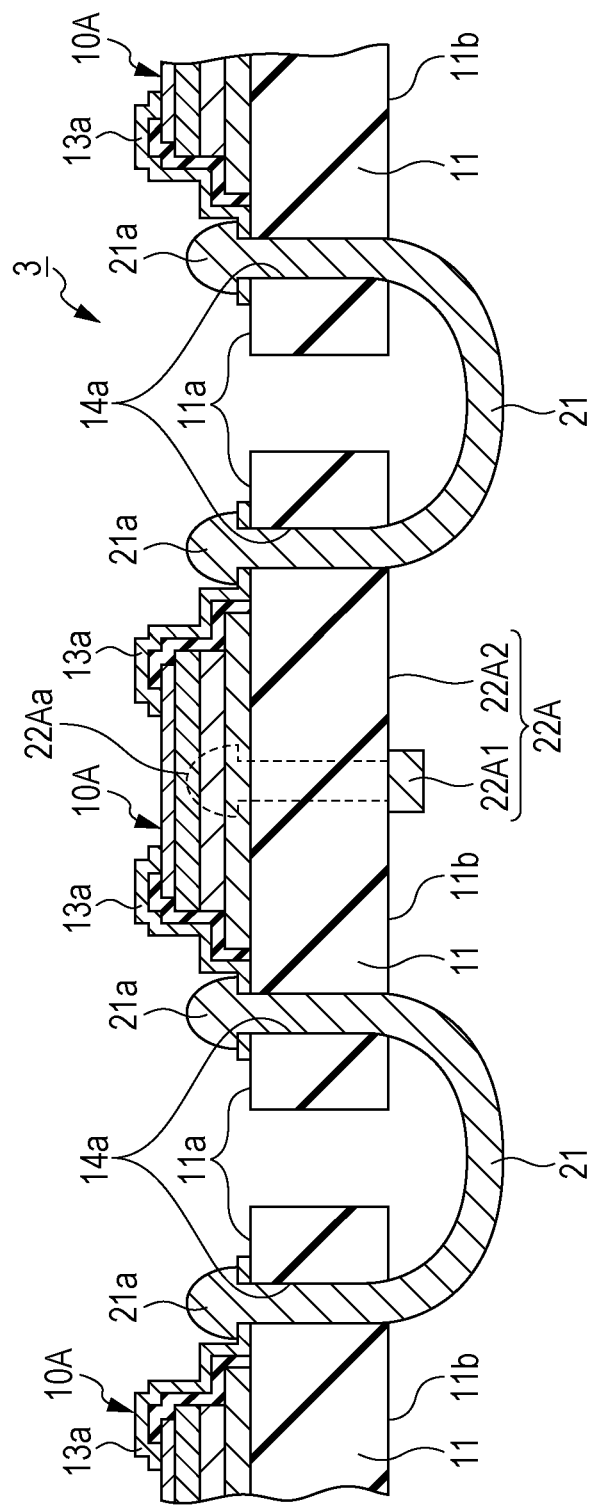
FIG. 17 is a drawing showing the connection relationship between LED chips and first wiring in the light emitting device according to embodiment 3.

Next, the connection relationship between the LED chips 10A and the wiring 20 (first wiring 21, second wiring 22A) in the light emitting device 3 is described using FIG. 17. FIG. 17 is a drawing showing the connection relationship between LED chips and wiring in the light emitting device according to embodiment 3.

As shown in FIG. 17, as in embodiment 1, the first wiring 21 is inserted through the first through-holes 14a for each two adjacent LED chips 10A and is connected to the first pad electrodes 13a.

Meanwhile, as shown in FIG. 14 and FIG. 17, rather than linking only two adjacent LED chips 10A, the second wiring 22A links at least three or more LED chips 10A in a series.

Specifically, the second wiring 22A has a main wiring part 22A1 that connects at least three or more LED chips 10A, and an auxiliary wiring part 22A2 that branches from the main wiring part 22A1 to each LED chip 10A. The second wiring 22A in the present embodiment links LED chips 10A in the column direction in a series.

As shown in FIG. 17, the main wiring part 22A1 is formed along the second principle surface 11b of the substrate 11. Furthermore, the auxiliary wiring part 22A2 is positioned inside the second through-hole 14b (not shown).

That is, with regard to the second wiring 22A, the auxiliary wiring part 22A2 passes through the second through-hole 14b of one LED chip from among two adjacent LED chips 10A and the second through-hole 14b of the other LED chip 10A, and thereby electrically connects a second pad electrode 13b of the one LED chip 10A and a second pad electrode 13b of the other LED chip 10A.

A tip-end part 22Aa of the second wiring 22A that is the tip-end part of the auxiliary wiring part 22A2 may be formed in a predetermined shape by processing the tip end of the auxiliary wiring part 22A2 that has passed through the second through-hole 14b.

Furthermore, as with the second wiring 22 in embodiment 1, the tip-end part 22Aa of the second wiring 22A has, at a cross section when cut at a plane that is level with the first principle surface 11a or the second principle surface 11b of the substrate 11, a larger cross-sectional area than the cross-sectional area of the second wiring 22A inside the second through-hole 14b. That is, in plan view, the tip-end part 22Aa of the second wiring 22A has an external diameter that is larger than the pore diameter of the second through-hole 14b. Specifically, the tip-end part 22Aa of the second wiring 22A is substantially hemispherical, and is formed in such a way as to cover the opening of the second through-hole 14b.

As described above, according to the light emitting device 3 according to the present embodiment, the same effect as in embodiment 1 is obtained. In other words, it is possible to suppress a load applied to connection portions between the wiring 20 and the electrodes of the LED chips 10A, and it is possible to reduce the occurrence of defects in electrical continuity and the like in the connection portions. Furthermore, in the present embodiment also, for each LED chip 10A, the first wiring 21 or the second wiring 22A and the LED chip 10A are linked and fixed, and it is therefore possible to easily link the plurality of LED chips 10A even when the first wiring 21 and the second wiring 22A are a thin wire material.

Furthermore, according to the light emitting device 3 in the present embodiment, the total number of through-holes is small compared to that in embodiment 1 or 2.

Thus, it is possible for the light emitting region 12 to be formed large, and it is therefore possible to make the light emission area of the LED chips 10 large. Furthermore, it is possible to reduce the cost of drilling the through-holes.

Furthermore, according to the light emitting device 3 in the present embodiment, the total number of pad electrodes is small compared to that in embodiment 1 or 2.

Thus, it is possible to suppress the occurrence of short-circuit defects between the first wiring 21 and the second wiring 22.

Furthermore, according to the light emitting device 3 in the present embodiment, the second wiring 22A links at least three or more LED chips 10A in a series.

Thus, it is possible to carry out connection work for the second wiring 22A and the LED chips 10A in a short time compared to that in embodiment 1. For example, due to the second wiring 22A linking the LED chips 10A in the column direction in a series, it is possible for the LED chips 10A in the column direction to be linked at the same time.

Figure 18:
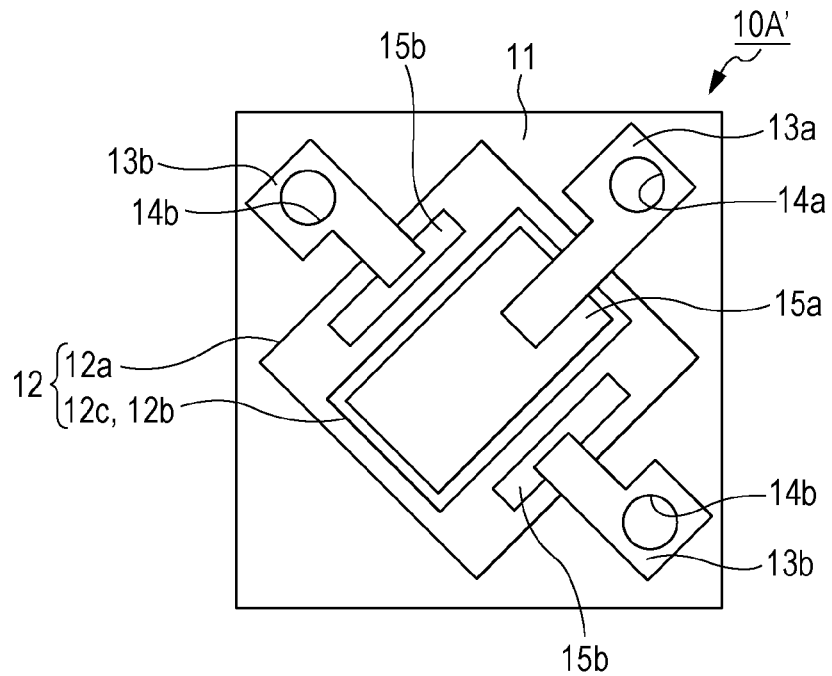
FIG. 18 is a plan view of an LED chip in a light emitting device according to modified example 1 of embodiment 3.

It should be noted that, in the present embodiment, two first through-holes 14a and one second through-hole 14b are provided; however, the present disclosure is not restricted to this. For example, as shown in FIG. 18, an LED chip 10A' that has one first through-hole 14a and two second through-holes 14b may be used. In this case, the structure and arrangement and the like of the first wiring 21 and the second wiring 22A may be reversed.

Furthermore, in the present embodiment, the first through-holes 14a and the second through-hole 14b are provided in corner portions (opposite corners) of the substrate 11; however, the present disclosure is not restricted to this. For example, LED chips in which the first through-holes 14a and the second through-hole 14b are provided at three sides of the four sides (opposite sides) of the substrate 11 may be arranged in a matrix, and two adjacent LED chips 10 may be connected by the first wiring 21 and the second wiring 22A.

Embodiment 4

Figure 19:
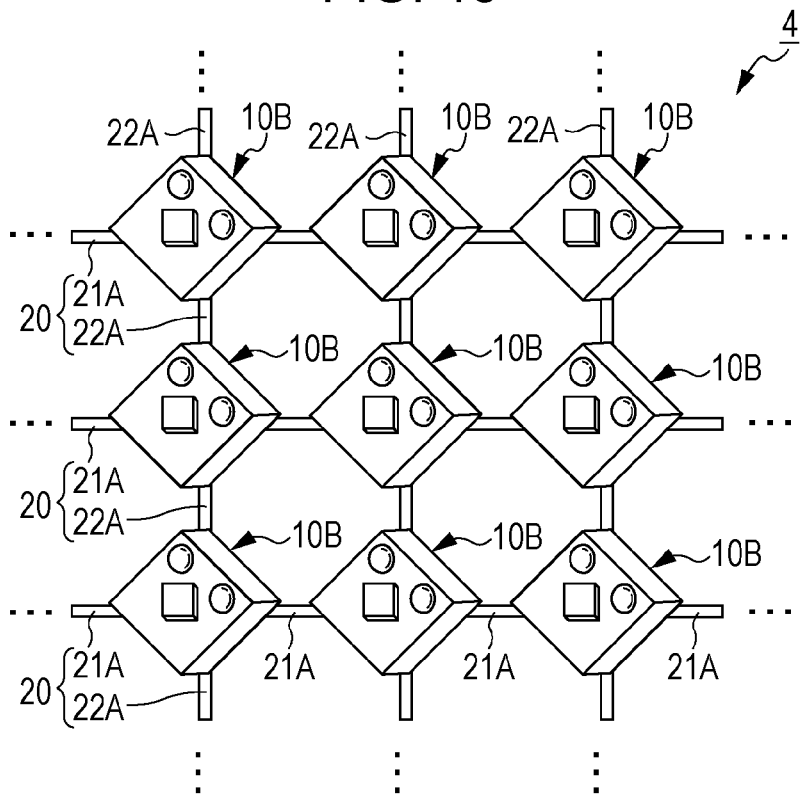
FIG. 19 is a schematic view depicting the configuration of a light emitting device according to embodiment 4.

Next, a light emitting device 4 according to embodiment 4 is described. FIG. 19 is a schematic view depicting the configuration of the light emitting device according to embodiment 4.

As shown in FIG. 19, the light emitting device 4 is provided with a plurality of LED chips 10B that are arranged in a matrix, and wiring 20 that links two adjacent LED chips 10B and also electrically connects electrodes of the two adjacent LED chips 10B.

In the present embodiment also, the wiring 20 passes through through-holes in the LED chips 10B, and is connected to the electrodes of the LED chips 10B. The wiring 20 is configured from first wiring 21A and second wiring 22A. The details are described later; however, the first wiring 21A has the same configuration as the second wiring 22A.

Figure 20:
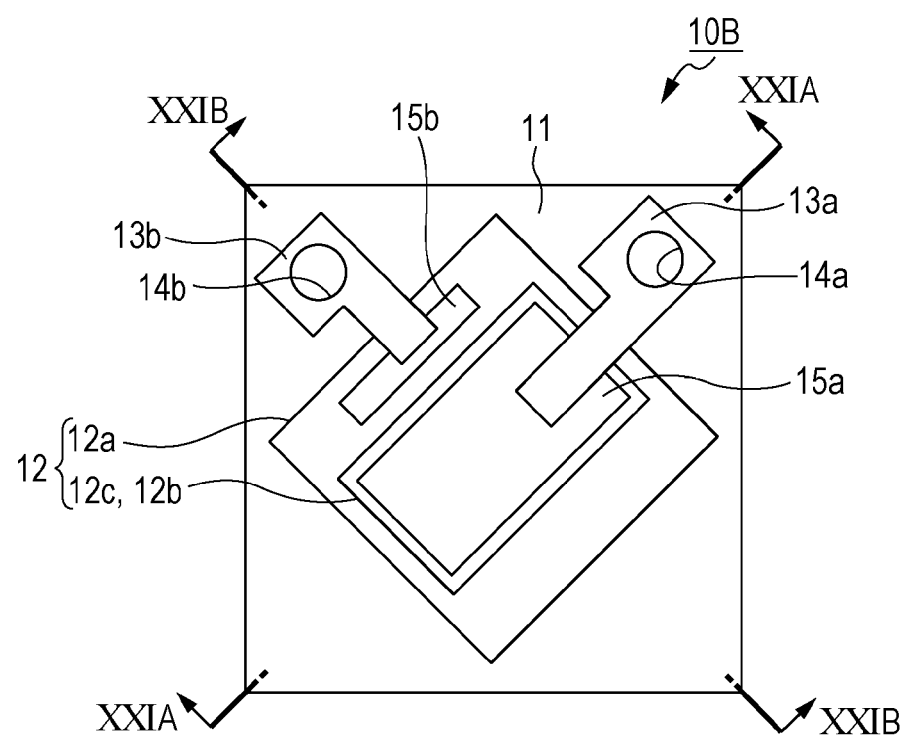
FIG. 20 is a plan view of an LED chip in the light emitting device according to embodiment 4.
Figure 21A:
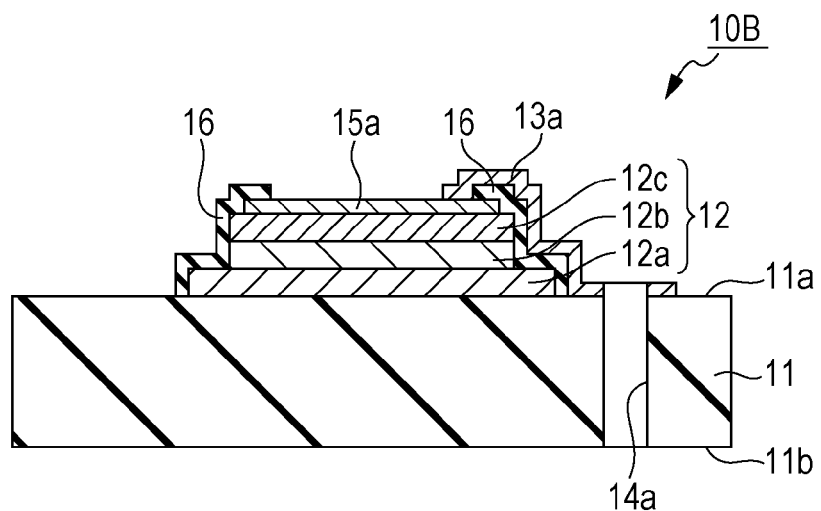
FIG. 21A is a cross-sectional view of the LED chip of FIG. 20, taken along a line XXIA-XXIA.
Figure 21B:
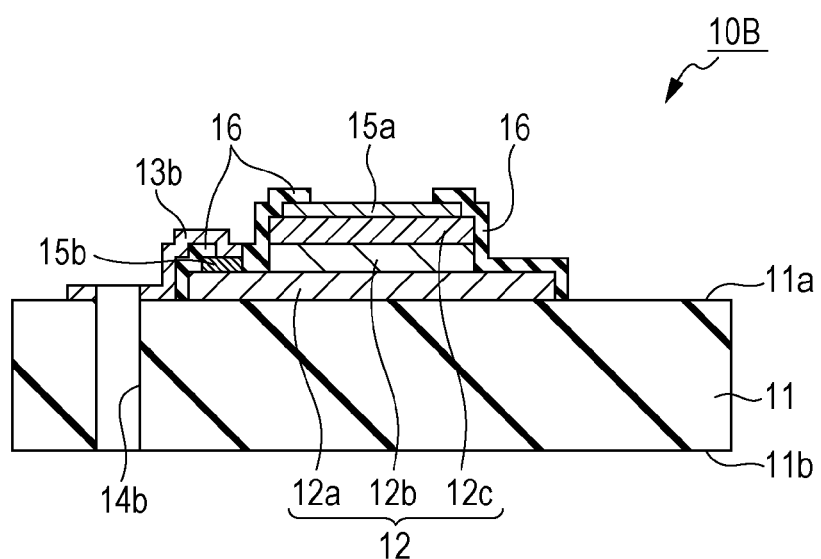
FIG. 21B is a cross-sectional view of the LED chip of FIG. 20, taken along a line XXIB-XXIB.

Next, the detailed structure of the LED chips 10B in the present embodiment is described using FIG. 20, FIG. 21A, and FIG. 21B. FIG. 20 is a plan view of an LED chip in the light emitting device according to embodiment 4. FIG. 21A is a cross-sectional view of FIG. 20, taken along a line XXIA-XXIA. FIG. 21B is a cross-sectional view of FIG. 20, taken along a line XXIB-XXIB. It should be noted that the insulator 16 is not shown in FIG. 20.

As shown in FIG. 20, FIG. 21A, and FIG. 21B, the LED chip 10B is provided with two through-holes. Specifically, one first through-hole 14a and one second through-hole 14b are provided in adjacent corner portions in the substrate 11.

It should be noted that the total number of pad electrodes in the substrate 11 is also two in accordance with the total number of through-holes. Specifically, one first pad electrode 13a and one second pad electrode 13b are provided in the substrate 11.

Next, the connection relationship between the LED chips 10B and the wiring 20 (first wiring 21A, second wiring 22A) in the light emitting device 4 is described using FIG. 22A and FIG. 22B. FIG. 22A illustrates the connection relationship between LED chips and first wiring in the light emitting device according to embodiment 4, and FIG. 22B illustrates the connection relationship between LED chips and second wiring in the light emitting device according to embodiment 4.

As shown in FIG. 22A, rather than linking only two adjacent LED chips 10B, the first wiring 21A links at least three or more LED chips 10B in a series.

Specifically, the first wiring 21A has a main wiring part 21A1 that connects at least three or more LED chips 10B, and an auxiliary wiring part 21A2 that branches from the main wiring part 21A1 to each LED chip 10B. The first wiring 21A in the present embodiment links LED chips 10B in the row direction in a series.

As shown in FIG. 22A, the main wiring part 21A1 is formed along the second principle surface 11b of the substrate 11. Furthermore, the auxiliary wiring part 21A2 is positioned inside the first through-hole 14a.

That is, in the first wiring 21A, the auxiliary wiring part 21A2 passes through the first through-hole 14a of one LED chip from among two adjacent LED chips 10B and the first through-hole 14a of the other LED chip 10B, and thereby electrically connects a first pad electrode 13a of the one LED chip 10B and a first pad electrode 13a of the other LED chip 10B.

A tip-end part 21Aa of the first wiring 21A that is the tip-end part of the auxiliary wiring part 21A2 may be formed in a predetermined shape by processing the tip end of the auxiliary wiring part 21A2 that has passed through the first through-hole 14a.

Furthermore, as with the first wiring 21 in embodiment 1, the tip-end part 21Aa of the first wiring 21A has, at a cross section when cut at a plane that is level with a principle surface of the substrate 11, a larger cross-sectional area than the cross-sectional area of the first wiring 21A inside the first through-hole 14a. That is, in plan view, the tip-end part 21Aa of the first wiring 21A has an external diameter that is larger than the pore diameter of the first through-hole 14a. Specifically, the tip-end part 21Aa of the first wiring 21A is substantially hemispherical, and is formed in such a way as to cover the opening of the first through-hole 14a.

As shown in FIG. 22B, the second wiring 22A has the same configuration as in embodiment 3; however, the main wiring part 22A1 of the second wiring 22A does not come into contact with the second principle surface 11b of the substrate 11, and is insulated and separated from the main wiring part 21A1 of the first wiring 21A by way of an insulating layer 30.

The insulating layer 30 should be formed at least between the main wiring part 21A1 of the first wiring 21A and the main wiring part 22A1 of the second wiring 22A. For example, the insulating layer 30 may be formed in a grid-like manner along the shape of the main wiring part 21A1 of the first wiring 21A and the main wiring part 22A1 of the second wiring 22A, or may be formed as a planar film.

As described above, according to the light emitting device 4 according to the present embodiment, the same effect as in embodiment 1 is obtained. In other words, it is possible to suppress the load applied to connection portions between the wiring 20 and the electrodes of the LED chips 10B, and it is possible to reduce the occurrence of defects in electrical continuity and the like in the connection portions. Furthermore, in the present embodiment also, for each LED chip 10B, the first wiring 21A or the second wiring 22A and the LED chip 10B are linked and fixed, and it is therefore possible to easily link the plurality of LED chips 10B even when the first wiring 21A and the second wiring 22A are a thin wire material.

Furthermore, according to the light emitting device 4 in the present embodiment, the total number of through-holes is further reduced compared to embodiment 3.

Thus, it is possible for the light emitting region 12 to be formed large, and it is therefore possible to make the light emission area of the LED chips 10B even larger. Furthermore, it is possible to further reduce the cost of drilling the through-holes.

Furthermore, according to the light emitting device 4 in the present embodiment, the total number of pad electrodes is further reduced compared to embodiment 3.

Thus, it is possible to further suppress the occurrence of short-circuit defects between the first wiring 21 and the second wiring 22.

It should be noted that, in the present embodiment, as in embodiment 1, the tip-end parts 21Aa and 22Aa are formed by welding the tip end of the auxiliary wiring part 21A2 of the first wiring 21A that has passed through the first through-hole 14a, and the tip end of the auxiliary wiring part 22A2 of the second wiring 22A that has passed through the second through-hole 14b; however, the present disclosure is not restricted to this.

For example, as shown in FIG. 23A, the tip end of the auxiliary wiring part 21A2 of the first wiring 21A that has passed through the first through-hole 14a may be bent along the surface of the first principle surface 11a of the substrate 11. Likewise, as shown in FIG. 23B, the tip end of the auxiliary wiring part 22A2 of the second wiring 22A that has passed through the second through-hole 14b may be bent along the surface of the first principle surface 11a of the substrate 11.

Embodiment 5

Figure 24:
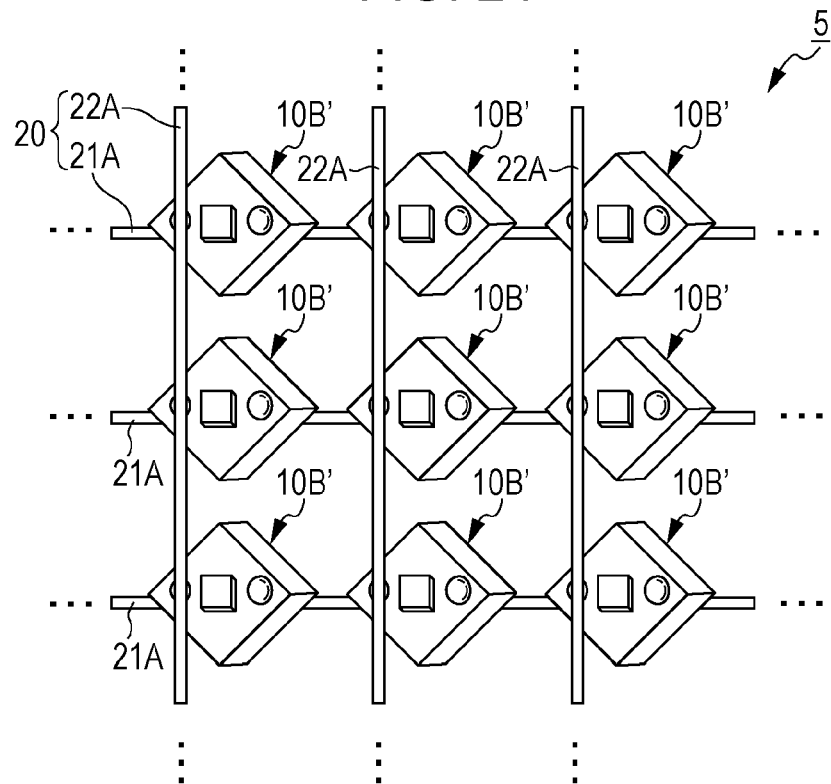
FIG. 24 is a schematic view showing the configuration of a light emitting device according to embodiment 5.

Next, a light emitting device 5 according to embodiment 5 is described. FIG. 24 is a schematic view showing the configuration of the light emitting device according to embodiment 5.

As shown in FIG. 24, as with the light emitting device 4 in embodiment 4, the light emitting device 5 in the present embodiment is provided with a plurality of LED chips 10B' that are arranged in a matrix, and wiring 20 that links two adjacent LED chips 10B' and also electrically connects electrodes of the two adjacent LED chips 10B'.

In the present embodiment also, the wiring 20 passes through through-holes in the LED chips 10B', and is connected to the electrodes of the LED chips 10B'. Furthermore, the wiring 20 is configured from first wiring 21A and second wiring 22A.

The light emitting device 5 according to the present embodiment is different from the light emitting device 4 in embodiment 4 in terms of the configuration of the LED chips 10B' and the arrangement of the wiring 20.

Figure 25:
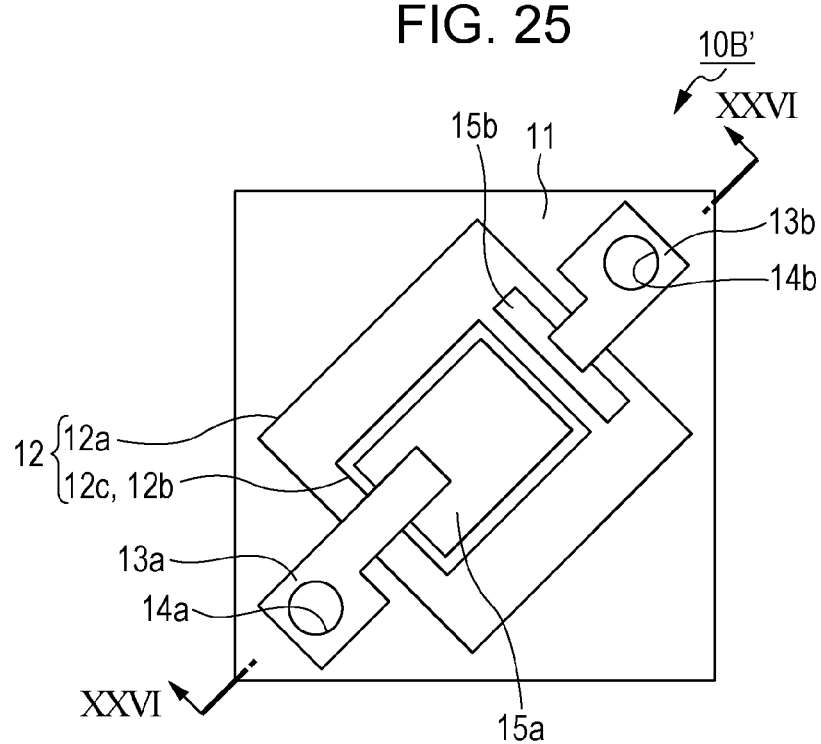
FIG. 25 is a plan view of an LED chip in the light emitting device according to embodiment 5.
Figure 26:
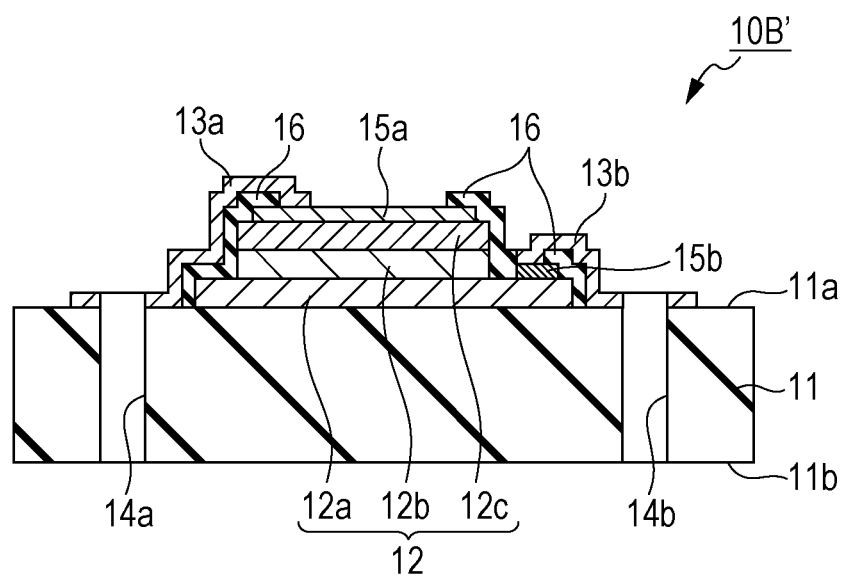
FIG. 26 is a cross-sectional view of the LED chip of FIG. 25, taken along a line XXVI-XXVI.

First, the detailed structure of the LED chips 10B' in the present embodiment is described using FIG. 25 and FIG. 26. FIG. 25 is a plan view of an LED chip in the light emitting device according to embodiment 5. FIG. 26 is a cross-sectional view of FIG. 25, taken along a line XXVI-XXVI. It should be noted that the insulator 16 is not shown in FIG. 25.

As shown in FIG. 25 and FIG. 26, there is a similarity with the LED chips 10B in embodiment 4 in that the LED chips 10B' have one first through-hole 14a and one second through-hole 14b; however, in the LED chips 10B' in the present embodiment, the first through-hole 14a and the second through-hole 14b are provided in opposite corner portions.

Figure 27:
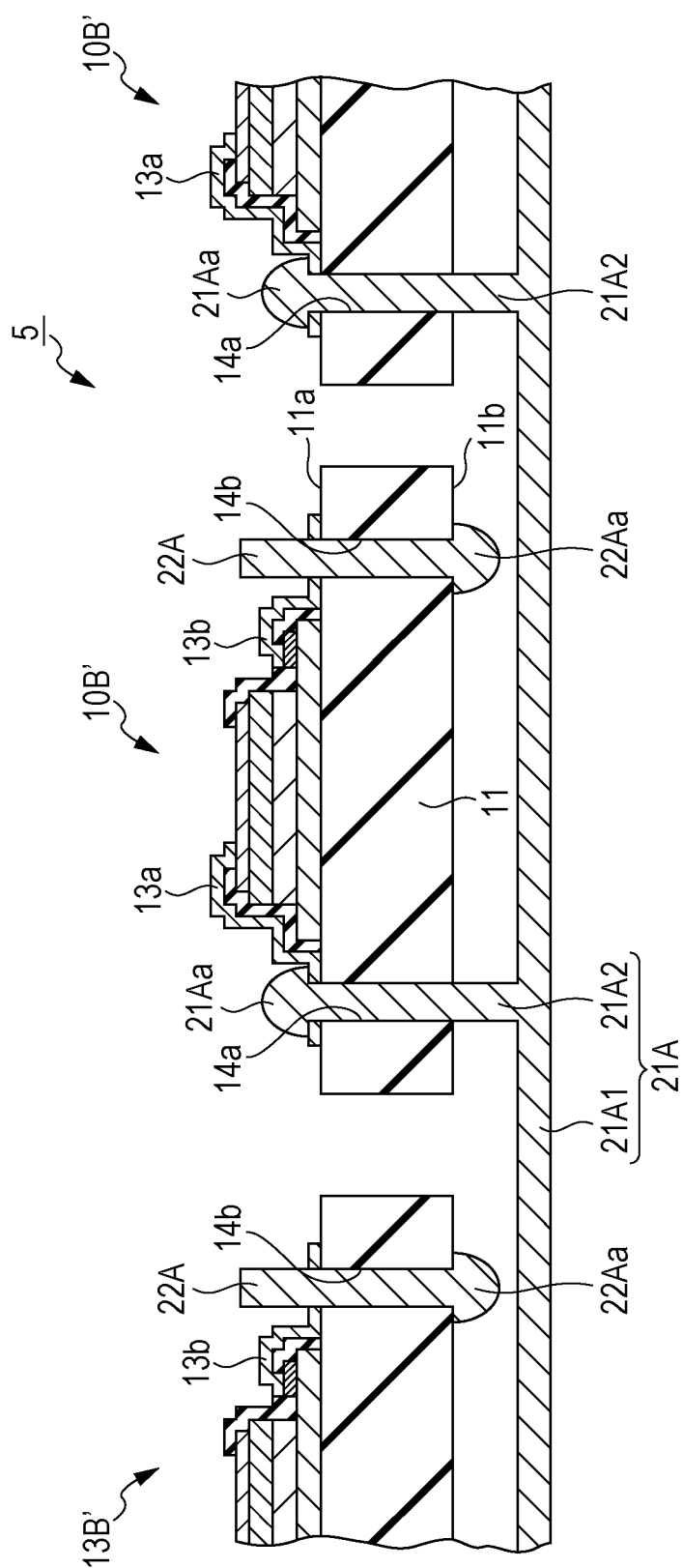
FIG. 27 illustrates the connection relationship between LED chips and wiring (first wiring, second wiring) in the light emitting device according to embodiment 5.

Next, the arrangement of the wiring 20 in the present embodiment is described using FIG. 27. FIG. 27 illustrates the connection relationship between LED chips and wiring (first wiring, second wiring) in the light emitting device according to embodiment 5.

As shown in FIG. 27, with regard to the first wiring 21A, auxiliary wiring parts 21A2 are introduced into a first through-hole 14a of one LED chip 10B' from among two adjacent LED chips 10B' and a first through-hole 14a of the other LED chip 10B' from the second principle surface 11b side of the substrate 11, and are inserted through the first through-holes 14a.

Meanwhile, with regard to the second wiring 22A, auxiliary wiring parts 22A2 are introduced into a second through-hole 14b of one LED chip 10B' from among two adjacent LED chips 10B' and a second through-hole 14b of the other LED chip 10B' from the first principle surface 11a side of the substrate 11, and are inserted through the second through-holes 14b.

Furthermore, a tip-end part 21Aa of the first wiring 21A and a tip-end part 22Aa of the second wiring 22A have the same configuration as in embodiment 4; however, the first wiring 21A is arranged in such a way that the tip-end part 21Aa does not come into contact with the second wiring 22A, and the second wiring 22A is arranged in such a way that the tip-end part 22Aa does not come into contact with the first wiring 21A.

As described above, according to the light emitting device 5 according to the present embodiment, the same effect as in embodiment 1 is obtained. In other words, it is possible to suppress the load applied to connection portions between the wiring 20 and the electrodes of the LED chips 10B', and it is possible to reduce the occurrence of defects in electrical continuity and the like in the connection portions. Furthermore, in the present embodiment also, for each LED chip 10B', the first wiring 21A or the second wiring 22A and the LED chip 10B' are linked and fixed, and it is therefore possible to easily link the plurality of LED chips 10B' even when the first wiring 21A and the second wiring 22A are a thin wire material.

Furthermore, according to the light emitting device 5 in the present embodiment, the LED chips 10B' are linked in the row direction with the first wiring 21A being inserted from the second principle surface 11b side of the substrate 11, and are linked in the column direction with the second wiring 22A being inserted from the first principle surface 11a side (light emitting region 12 side) of the substrate 11.

Thus, the first wiring 21A and the second wiring 22A are positioned with the LED chips 10 therebetween, and it is therefore possible to suppress short-circuiting between the first wiring 21A and the second wiring 22B.

Therefore, it is not necessary to form a separate insulator or the like in order to suppress a short-circuit defect between the first wiring 21A and the second wiring 22A; however, if the light emitting device 5 is flexed, there is a possibility that a tip-end part of the first wiring 21A or the second wiring 22A may come into contact with the wiring of the other and cause a short-circuit defect. Therefore, in order to prevent such a short-circuit defect, for example, an insulating member such as an insulator may be provided between the tip-end part 21Aa of the first wiring 21A and the main wiring part 22A1 of the second wiring 22A, and between the tip-end part 22Aa of the second wiring 22A and the main wiring part 21A1 of the first wiring 21A.

Figure 28:
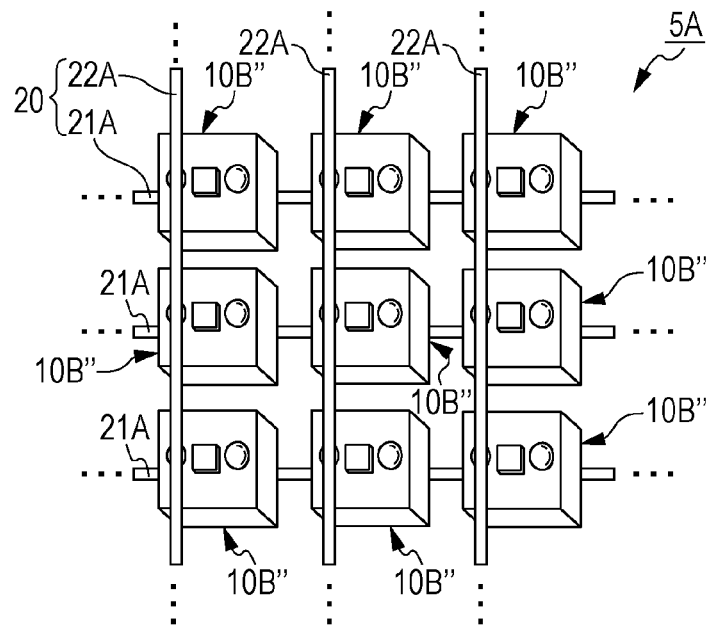
FIG. 28 is a schematic view showing the configuration of a light emitting device according to modified example 1 of embodiment 5.
Figure 29:
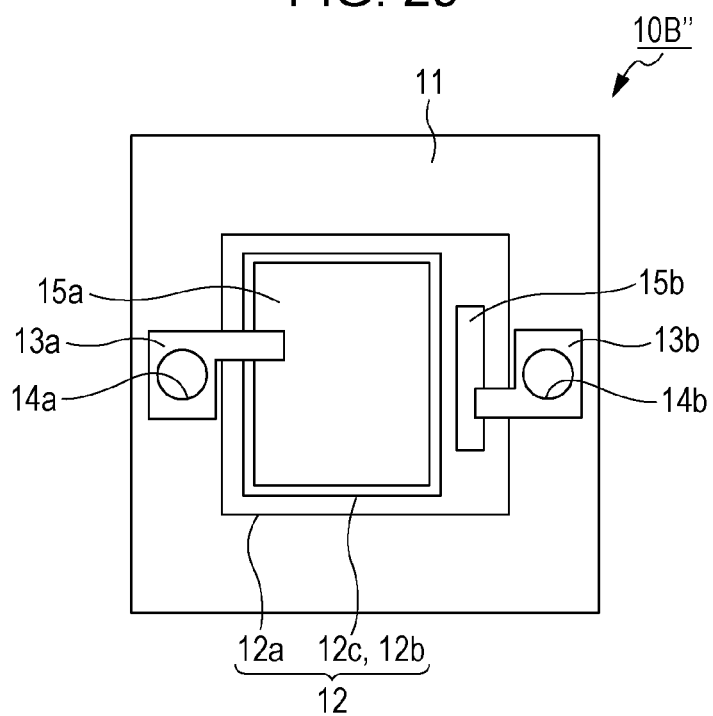
FIG. 29 is a plan view of an LED chip in the light emitting device according to modified example 1 of embodiment 5.

Furthermore, in the present embodiment, the first through-hole 14a and the second through-hole 14b are provided in corner portions (opposite corners) of the substrate 11; however, the present disclosure is not restricted to this. For example, as shown in FIG. 28 and FIG. 29, LED chips 10B'' having a configuration in which the first through-hole 14a and the second through-hole 14b are provided in two opposite sides of the substrate 11 may be arranged in a matrix, and two adjacent LED chips 10B'' may be connected by the first wiring 21A and the second wiring 22A.

Thus, it is possible for the arrangement pitch of the LED chips 10B'' to be made smaller, and it is therefore possible to realize a light emitting device 5A in which the LED chips 10B'' are arranged with high-density.

Embodiment 6

Figure 30:
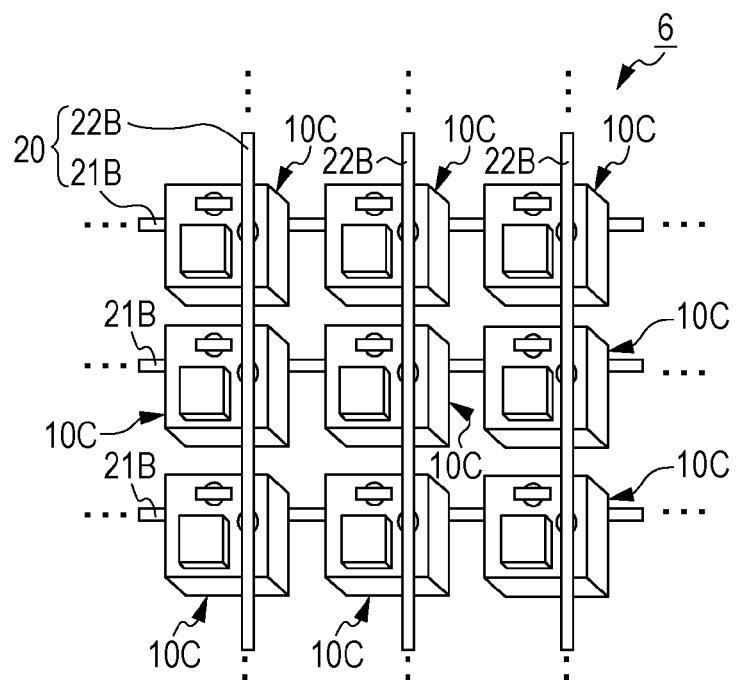
FIG. 30 is a schematic view showing the configuration of a light emitting device according to embodiment 6.

Next, a light emitting device 6 according to embodiment 6 is described. FIG. 30 is a schematic view showing the configuration of the light emitting device according to embodiment 6.

As shown in FIG. 30, the light emitting device 6 is provided with a plurality of LED chips 10C that are arranged in a matrix, and wiring 20 that links two adjacent LED chips 10C and also electrically connects electrodes of the two adjacent LED chips 10C.

In the present embodiment also, the wiring 20 passes through through-holes in the LED chips 10C, and is connected to the electrodes of the LED chips 10C.

The wiring 20 is configured from first wiring 21B and second wiring 22B. As with the first wiring 21 and the second wiring 22 in embodiment 1, the first wiring 21B and the second wiring 22B may be provided in plurality for each two adjacent LED chips 10C, and may be configured from a main wiring part and an auxiliary wiring part as with the first wiring 21A and the second wiring 22A in embodiment 5.

Figure 31:
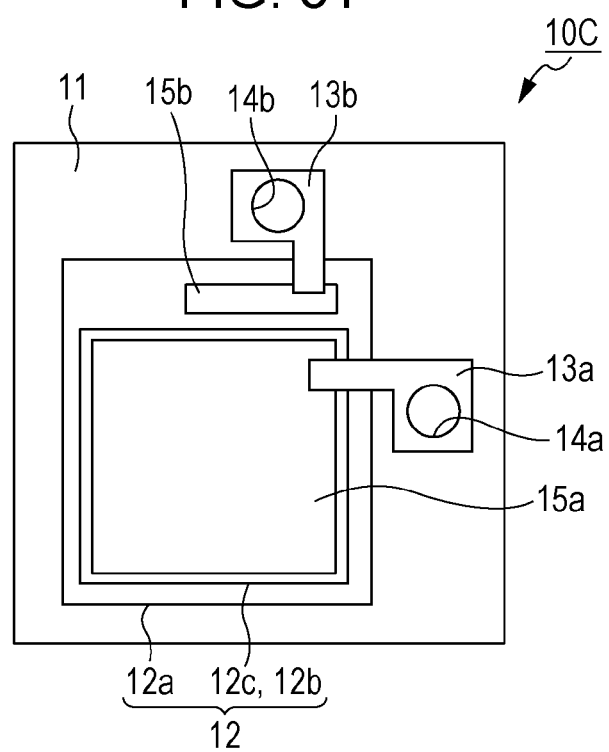
FIG. 31 is a plan view of an LED chip in the light emitting device according to embodiment 6.

Next, the detailed structure of the LED chips 10C in the present embodiment is described using FIG. 31. FIG. 31 is a plan view of an LED chip in the light emitting device according to embodiment 6.

As shown in FIG. 31, there is a similarity with the LED chip 10B in embodiment 4 in that the LED chip 10C has one first through-hole 14a and one second through-hole 14b; however, in the LED chip 10C in the present embodiment, the first through-hole 14a and the second through-hole 14b are provided in two adjacent sides.

As described above, according to the light emitting device 6 according to the present embodiment, the same effect as in embodiment 1 is obtained. In other words, it is possible to suppress a load applied to connection portions between the wiring 20 and the electrodes of the LED chips 10C, and it is possible to reduce the occurrence of defects in electrical continuity and the like in the connection portions. Furthermore, in the present embodiment also, for each LED chip 10C, the first wiring 21B or the second wiring 22B and the LED chip 10C are linked and fixed, and it is therefore possible to easily link the plurality of LED chips 10C even when the first wiring 21B and the second wiring 22B are a thin wire material.

Furthermore, the through-holes of one LED chip have inserted therethrough first wiring to which an electrode of an adjacent other LED chip and an electrode of the one LED chip are electrically connected, and second wiring to which an electrode of an adjacent third LED chip and the electrode of the one LED chip are electrically connected. Therefore, if the light emitting device is flexed, it is possible to alleviate the bent state of the wiring that curves, and it is therefore possible to reduce the bending stress load that is applied to the wiring. In addition, in order to link the one LED chip to the other LED chip and the third LED chip, it is sufficient for the one LED chip to have one common through-hole rather than two through-holes being separately formed, thereby simplifying the configuration.

Next, a manufacturing method for the light emitting device 6 in the present embodiment is described using FIG. 32A to FIG. 32K. FIG. 32A to FIG. 32L are process drawings for describing the manufacturing method for the light emitting device according to embodiment 6.

Figure 32A:
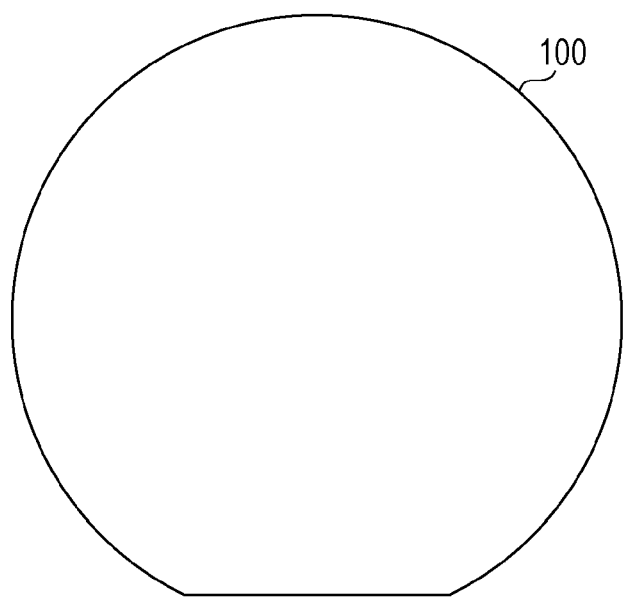
FIG. 32A illustrates a substrate preparation step in a manufacturing method for the light emitting device according to embodiment 6.

As shown in FIG. 32A, first, a wafer 100 that is a base material substrate for the substrate 11 is prepared in order to manufacture a plurality of LED chips 10C. For example, a sapphire substrate may be used as the wafer 100.

Figure 32B:
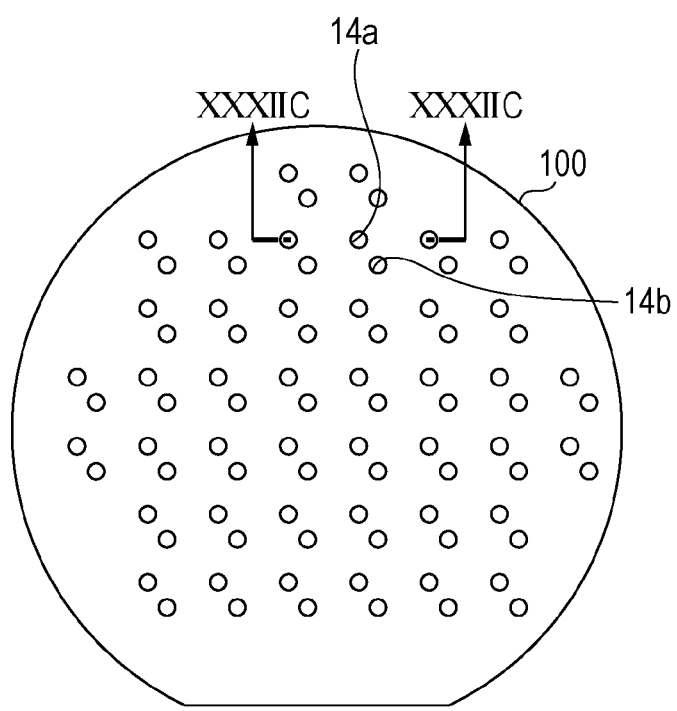
FIG. 32B illustrates a through-hole forming (drilling) step in the manufacturing method for the light emitting device according to embodiment 6.

Next, as shown in FIG. 32B, first through-holes 14a and second through-holes 14b that penetrate the wafer 100 are formed in the wafer 100. For example, using a laser, a plurality of first through-holes 14a and a plurality of second through-holes 14b are formed in such a way that both faces of the wafer 100 are penetrated. The first through-holes 14a and the second through-holes 14b are formed in such a way as to be positioned around light emitting regions 12 in the LED chips 10C.

In this way, by forming the first through-holes 14a and the second through-holes 14b before forming semiconductor layers such as the light emitting regions 12, it is possible to prevent the semiconductor layers being damaged by the heat of the laser and it is also possible for the drilling of the wafer 100 to be easily carried out, and it is therefore possible to easily form the first through-holes 14a and the second through-holes 14b.

Figure 32C:
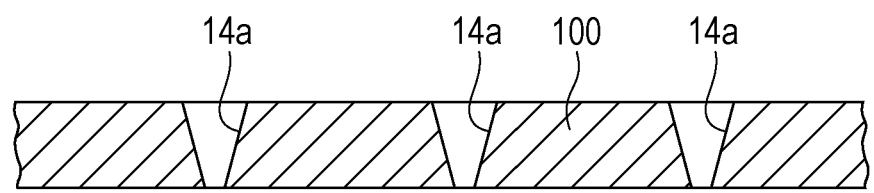
FIG. 32C illustrates a substrate polishing step in the manufacturing method for the light emitting device according to embodiment 6.
Figure 32D:
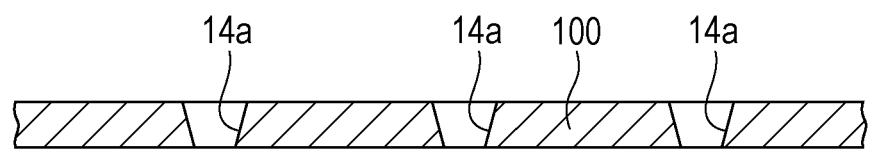
FIG. 32D illustrates the substrate polishing step in the manufacturing method for the light emitting device according to embodiment 6.

Next, the back face of the wafer 100 shown in FIG. 32C is polished and so forth for the wafer 100 to be made thinner as in FIG. 32D. FIG. 32C is a cross-sectional view along a line XXXIIC-XXXIIC in FIG. 32B as seen in the direction of the arrows. It is possible to thinly process the wafer 100 by chemical mechanical polishing (CMP), for example.

In this way, by making the wafer 100 thinner, it is possible to make the pore diameter difference between the front face side and the back face side of the wafer 100 smaller with regard to the first through-holes 14a and the second through-holes 14b. Therefore, it is possible to make the pore diameters at the front face side of the wafer 100 and the pore diameters and the back face side the same or different on purpose.

Furthermore, by polishing the wafer 100, it is also possible to remove burrs and the like generated in the open portions of the first through-holes 14a and the second through-holes 14b by the laser processing.

Figure 32E:
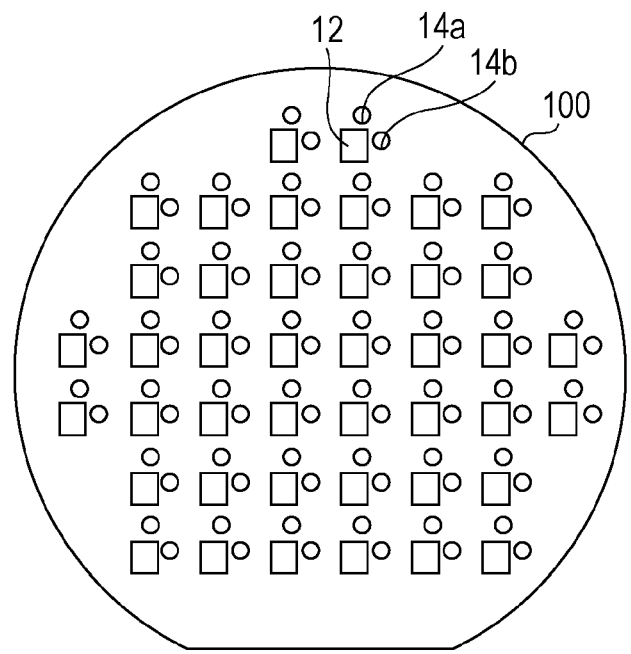
FIG. 32E illustrates a light emitting region forming step in the manufacturing method for the light emitting device according to embodiment 6.

Next, as shown in FIG. 32E, a plurality of light emitting regions 12 having a predetermined shape are formed in predetermined positions on the wafer 100. For example, by forming a plurality of semiconductor layers and carrying out patterning, it is possible to form a plurality of island-like light emitting regions 12 formed from a laminated structure that includes an n-type semiconductor layer 12a, an active layer 12b, and a p-type semiconductor layer 12c.

Next, although not shown, p-side electrodes 15a, n-side electrodes 15b, insulators 16, first pad electrodes 13a, and second pad electrodes 13b are formed on the wafer 100.

Figure 32F:
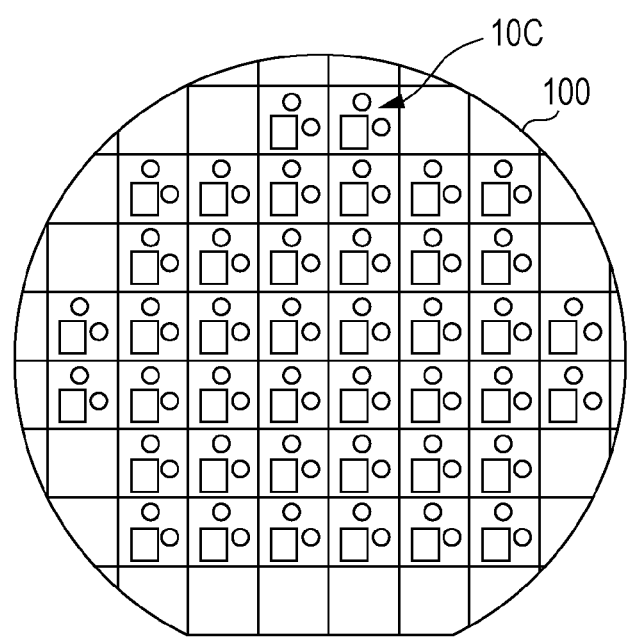
FIG. 32F illustrates a chip separation step (dicing step) in the manufacturing method for the light emitting device according to embodiment 6.

Next, as shown in FIG. 32F, the wafer 100 is divided so as to be separated into a plurality of LED chips 10C. In this case, the wafer 100 is divided in such a way that each LED chip 10C includes at least one through-hole, at least one light emitting region, and at least one electrode.

Specifically, the wafer 100 is diced in such a way that each LED chip 10C includes a first through-hole 14a and a second through-hole 14b, a light emitting region 12, and a first pad electrode 13a and a second pad electrode 13b.

Figure 32G:
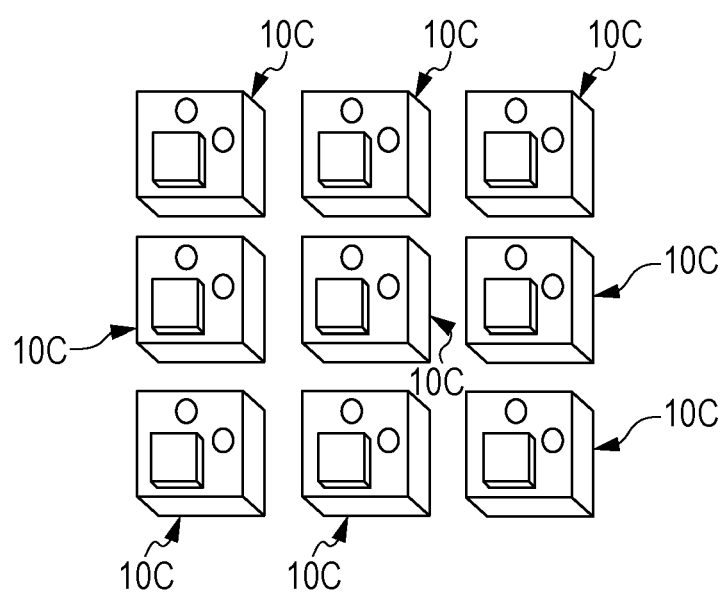
FIG. 32G illustrates an LED chip arrangement step in the manufacturing method for the light emitting device according to embodiment 6.

Next, as shown in FIG. 32G, the plurality of LED chips 10C are positioned such that the plurality of LED chips 10C are arranged in predetermined lines. For example, the plurality of LED chips 10C are arranged in a matrix.

Figure 32H:
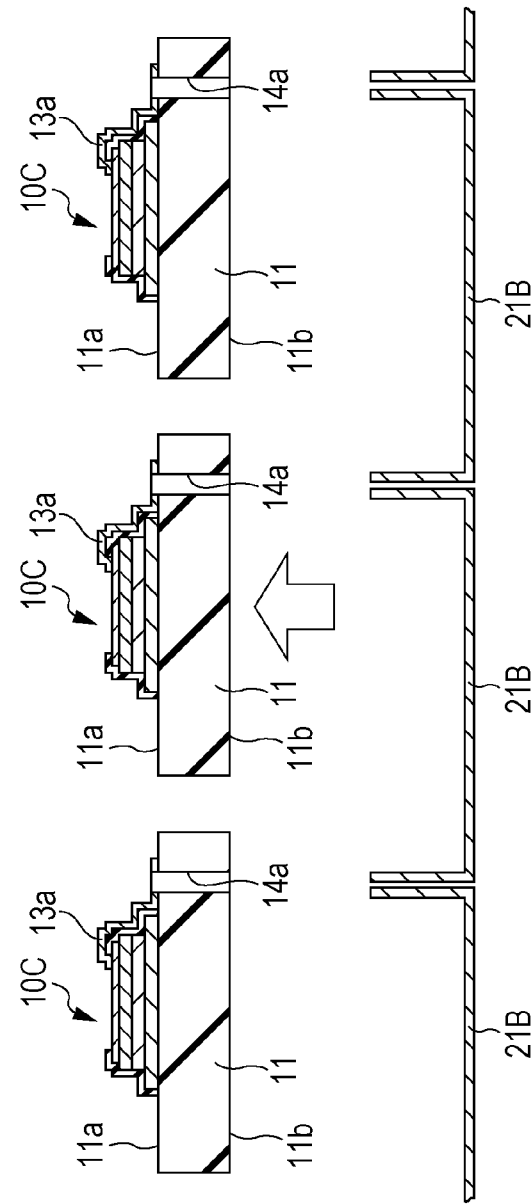
FIG. 32H illustrates a wiring insertion step (before insertion) in the manufacturing method for the light emitting device according to embodiment 6.
Figure 32I:
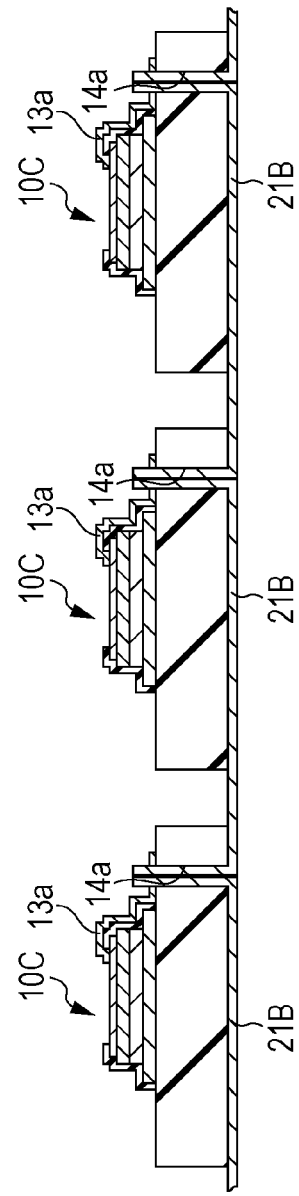
FIG. 32I illustrates the wiring insertion step (after insertion) in the manufacturing method for the light emitting device according to embodiment 6.

Next, as shown in FIG. 32H, the tip ends of U-shaped first wiring 21B are introduced into the first through-holes 14a of two adjacent LED chips 10 from the second principle surface 11b side of the substrate 11, and, as shown in FIG. 32I, are inserted through the first through-holes 14a.

Figure 32J:
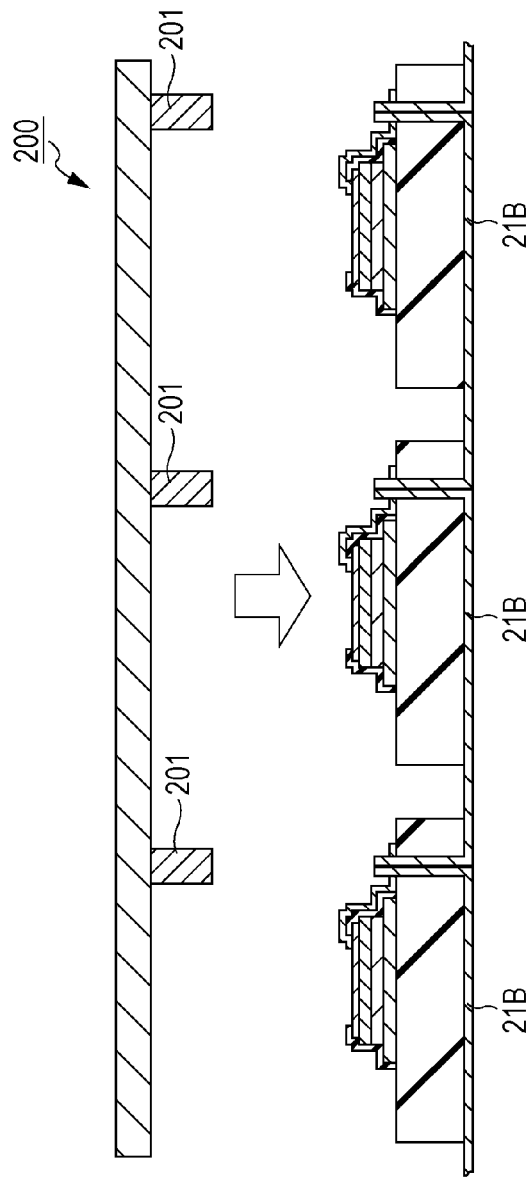
FIG. 32J illustrates a wiring tip-end processing step (before processing) in the manufacturing method for the light emitting device according to embodiment 6.

Next, as shown in FIG. 32J, a pressure welding apparatus 200 is arranged in such a way that pressurizing terminals 201 oppose the tip ends of the first wiring 21B.

Figure 32K:
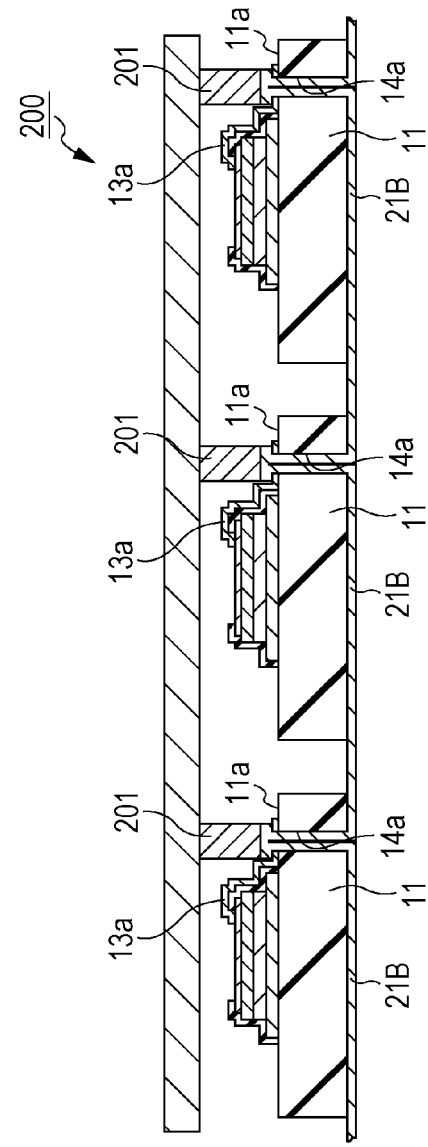
FIG. 32K illustrates the wiring tip-end processing step (after processing) in the manufacturing method for the light emitting device according to embodiment 6.

Next, as shown in FIG. 32K, the pressurizing terminals 201 are brought into contact with the tip ends of the first wiring 21B and the tip ends of the first wiring 21B are processed. At such time, the tip ends of the first wiring 21B inserted through the first through-holes 14a are processed into tip-end parts of a predetermined shape in such a way as to have, at a cross section when cut at a plane that is parallel to the first principle surface 11a of the substrate 11, a larger cross-sectional area than the cross-sectional area of the first wiring 21B inside the first through-holes 14a.

Thus, it is possible to connect the first pad electrodes 13a of two adjacent LED chips 10C and the first wiring 21B, and also to link and fix the first wiring 21B and the two adjacent LED chips 10C.

It should be noted that a guide may be provided in such a way as to surround the pressurizing terminals 201 in order to suppress the light emitting regions 12 being damaged by the pressurizing terminals 201.

Thereafter, although not shown, by using the same method as that for the first wiring 21B also for the second wiring 22B, it is possible to connect the second pad electrodes 13b of two adjacent LED chips 10C and the second wiring 22B, and also to link and fix the second wiring 22B and the two adjacent LED chips 10C.

Figure 32L:
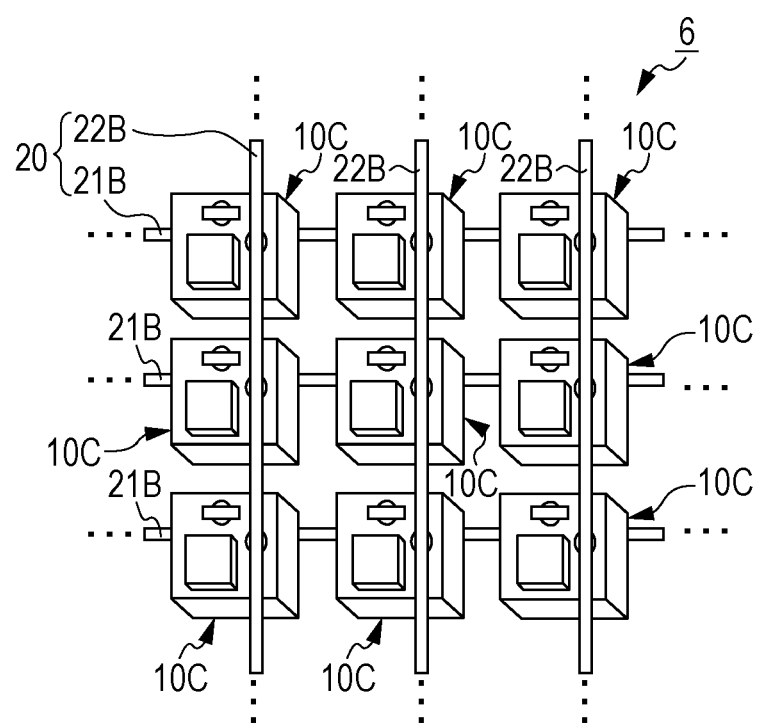
FIG. 32L illustrates a completed light emitting device in the manufacturing method for the light emitting device according to embodiment 6.

According to the above, it is possible to manufacture the light emitting device 6 as shown in FIG. 32L.

It should be noted that, in the present embodiment, as shown in FIG. 32G, the first wiring 21B is provided in plurality for each two adjacent LED chips 10C; however, as shown in FIG. 33, first wiring 21B' that is integrally configured from a main wiring part 21B1 and auxiliary wiring parts 21B2 may be used. The same applies to the second wiring 22B.

Furthermore, it is possible for the manufacturing method for the light emitting device in the present embodiment to also be applied to the other aforementioned embodiments. That is, it is possible for the light emitting devices in the other aforementioned embodiments to also be manufactured based on the manufacturing method of the present embodiment. For example, in embodiment 1, a discharge welding apparatus may be used instead of the pressure welding apparatus 200 to carry out welding when the tip ends of the first wiring 21 and the second wiring 22 are processed.

Embodiment 7

Figure 34:
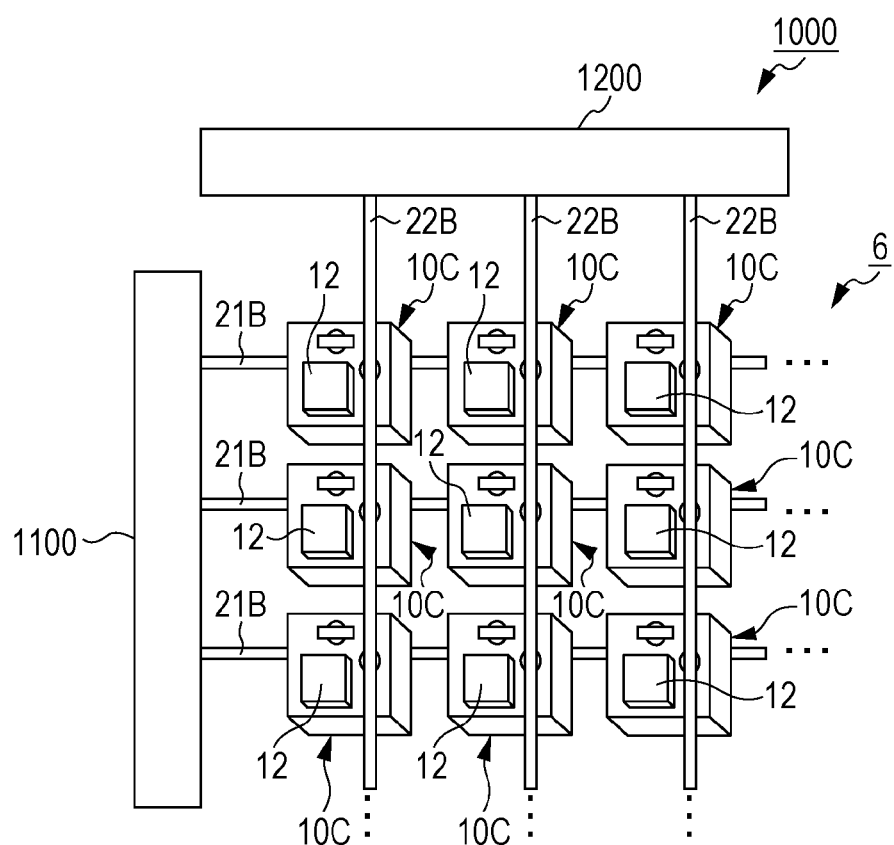
FIG. 34 is a schematic view of a display device according to embodiment 7.

Next, a display device 1000 according to embodiment 7 is described using FIG. 34. FIG. 34 is a schematic view of a display device according to embodiment 7.

As shown in FIG. 34, the display device 1000 is provided with the light emitting device 6 of embodiment 6, a scan driver 1100, and a data driver 1200.

Each first wiring 21B of the light emitting device 6 is connected to the scan driver 1100. Thus, a scan signal (scan voltage) is supplied from the scan driver 1100 to the p-side electrodes 15a (not shown) of the LED chips 10C via the first wiring 21B.

Furthermore, each second wiring 22B of the light emitting device 6 is connected to the data driver 1200. Thus, a data signal (data voltage) is supplied from the data driver 1200 to the n-side electrodes 15b (not shown) of the LED chips 10C via the second wiring 22B.

In the display device 1000 configured in this way, it is possible for the light emitting region 12 of a predetermined LED chip 10C to be selectively made to emit light by supplying a current to the predetermined LED chip 10C by using the scan driver 1100 and the data driver 1200.

Therefore, it is possible to realize a display device that displays a desired image by having each LED chip 10C correspond to a display pixel. Furthermore, the display device 1000 in the present embodiment uses the light emitting device 6 that has flexibility, and it is therefore possible to realize a cloth-like display device that has flexibility.

Other Modified Examples, Etc

Heretofore, embodiments of the present disclosure have been described; however, the present disclosure is not restricted to the aforementioned embodiments.

Figure 35:
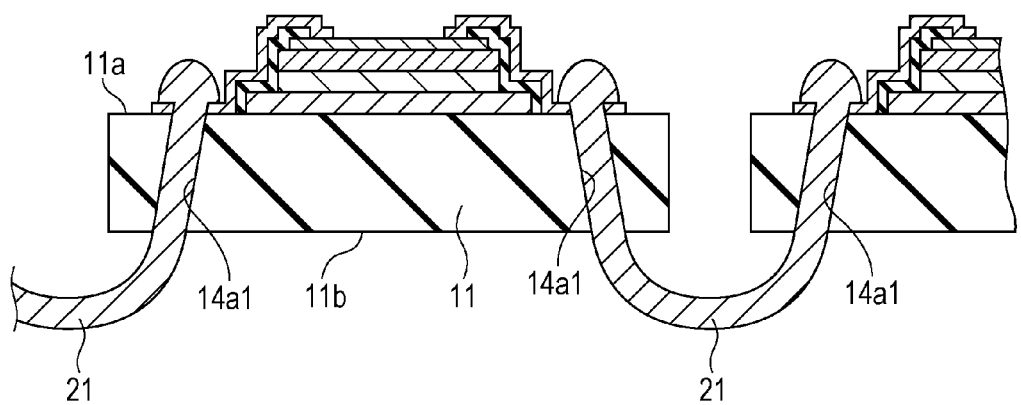
FIG. 35 illustrates the connection relationship between LED chips and first wiring in a light emitting device according to modified example 1.

For example, in the aforementioned embodiments, the first through-holes 14a penetrate in a direction perpendicular to the first principle surface 11a of the substrate 11; however, the present disclosure is not restricted to this. For example, as shown in FIG. 35, first through-holes 14al may be formed by being made to penetrate in such a way as to be inclined with respect to the first principle surface 11a of the substrate 11. In this case, the first through-holes 14al may be inclined in such a way as to approach, from the first principle surface 11a to the second principle surface 11b, the outside of the substrate 11 (the outer peripheral side of the LED chip). Thus, it is possible to reduce the possibility of the first wiring 21 breaking at the opening ends of the first through-holes 14al at the first principle surface 11a side of the substrate 11. In addition, it is possible to alleviate the bent state of the first wiring 21 that curves, and it is therefore possible to reduce the bending stress load that is applied to the first wiring 21.

Figure 36:
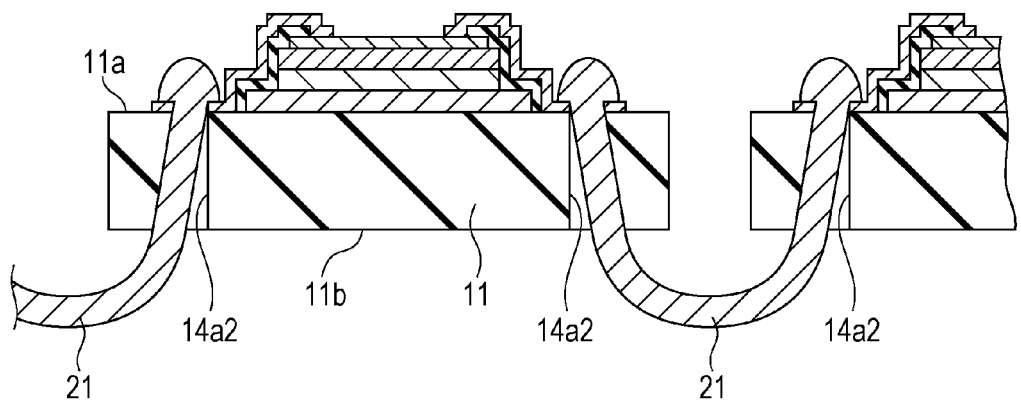
FIG. 36 illustrates the connection relationship between LED chips and first wiring in a light emitting device according to modified example 2.

Furthermore, in the aforementioned embodiments, the pore diameter of the first through-holes 14a is fixed; however, the present disclosure is not restricted to this. In this case, as shown in FIG. 36, at least the outer face (the face at the outer peripheral side of the LED chip) of the inner peripheral surface of first through-holes 14a2 may be inclined in such a way as to approach, from the first principle surface 11a to the second principle surface 11b, the outside of the substrate 11 (the outer peripheral side of the LED chip). In this case also, it is possible to reduce the possibility of the first wiring 21 breaking at the opening ends of the first through-holes 14a2 at the first principle surface 11a side of the substrate 11. Furthermore, it is possible to alleviate the bent state of the first wiring 21 that curves, and it is therefore possible to reduce the bending stress load that is applied to the first wiring 21.

Figure 37:
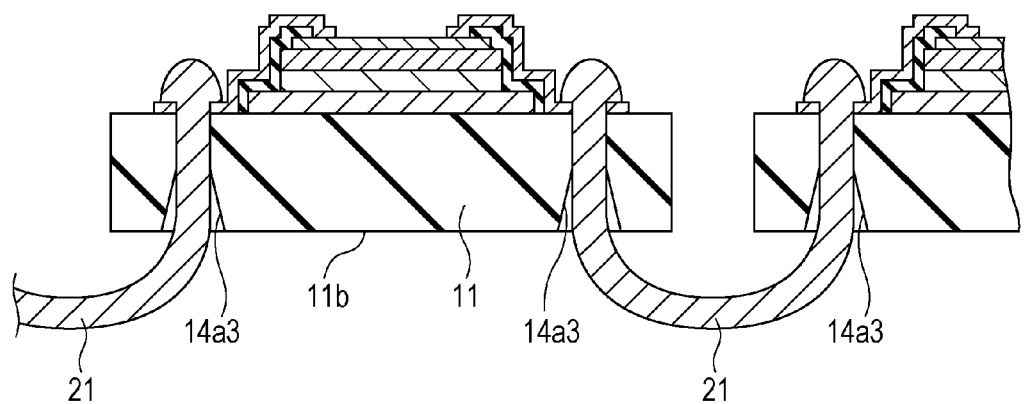
FIG. 37 illustrates the connection relationship between LED chips and first wiring in a light emitting device according to modified example 3.

Furthermore, when an inclined face is formed in the inner peripheral surface of the first through-holes, the inclined face does not have to be continuously formed from the first principle surface 11a of the substrate 11 to the second principle surface 11b. For example, as shown in FIG. 37, in first through-holes 14a3, an inclined face may be formed only in the vicinity of the openings at the second principle surface 11b side where the curved portion of the first wiring 21 is present. In this case also, it is possible to reduce the occurrence of breakages of the first wiring 21, and it is also possible to reduce the bending stress load that is applied to the first wiring 21.

It should be noted that it is possible for the inclination angle of the first through-holes and the forming position of the inclined faces in FIG. 35 to FIG. 37 to be adjusted by way of the direction of the laser with respect to the substrate 11 and the polishing or the like of the substrate 11. Furthermore, it is possible for the same configurations to be implemented not only for the first through-holes but also for the second through-holes.

Figure 38:
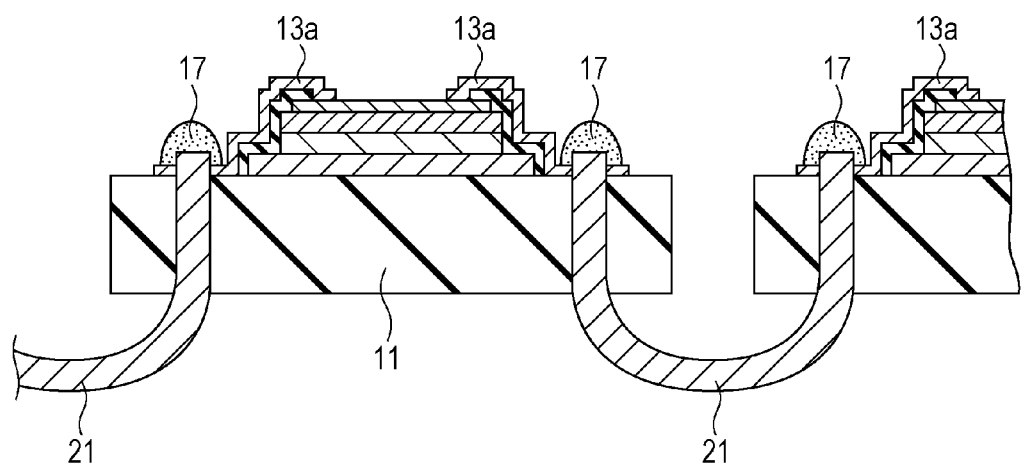
FIG. 38 illustrates the connection relationship between LED chips and first wiring in a light emitting device according to modified example 4.

Furthermore, in the aforementioned embodiments, the tip-end parts 21a of the first wiring 21 are formed in a shape having a larger cross-sectional area than the cross-sectional area of the first wiring 21 inside the first through-holes 14a, by processing the tip ends of the first wiring 21 that have passed through the first through-holes 14a; however, the present disclosure is not restricted to this. For example, as shown in FIG. 38, the first pad electrodes 13a and the first wiring 21 may be electrically and physically connected by forming a conductive adhesive 17 such as solder in such a way as to cover the tip ends of the first wiring 21 that have passed through the first through-holes 14a.

Furthermore, in the aforementioned embodiments, the first wiring 21 electrically connects the anode-side electrodes (first pad electrode 13a, p-side electrode 15a) of one LED chip from among two adjacent LED chips, and the anode-side electrodes (first pad electrode 13a, p-side electrode 15a) of the other LED chip (that is, electrically connects the anode-side electrodes); however, the present disclosure is not restricted to this.

Furthermore, in the aforementioned embodiments, the second wiring 22 electrically connects the cathode-side electrodes (second pad electrode 13b, n-side electrode 15b) of one LED chip from among two adjacent LED chips, and the cathode-side electrodes (second pad electrode 13b, n-side electrode 15b) of the other LED chip (that is, electrically connects the cathode-side electrodes); however, the present disclosure is not restricted to this.

For example, the first wiring 21 may electrically connect the anode-side electrodes (first pad electrode 13a, p-side electrode 15a) of one LED chip from among two adjacent LED chips, and the cathode-side electrodes (second pad electrode 13b, n-side electrode 15b) of the other LED chip.

Furthermore, the second wiring 22 may also electrically connect the anode-side electrodes (first pad electrode 13a, p-side electrode 15a) of one LED chip from among two adjacent LED chips, and the cathode-side electrodes (second pad electrode 13b, n-side electrode 15b) of the other LED chip.

That is, the first wiring 21 and the second wiring 22 may connect electrodes of the same polarity, or may connect electrodes of different polarities.

Furthermore, a wavelength conversion material may be combined in the aforementioned embodiments in order to convert the wavelength of light emitted by an LED chip. Furthermore, an optical member such as a color filter may additionally be appropriately combined as the display device.

Other modes obtained by carrying out various modifications conceived by those skilled in the art with respect to the embodiments, and modes realized by arbitrarily combining constituent elements and functions in the embodiments without departing from the purpose of the present disclosure are also included within the present disclosure.

The present disclosure is useful in a light emitting device, a display device, and a manufacturing method for a light emitting device and the like, and may be applied in a display device or the like that is used being flexed to have a curved surface.

What is claimed is:

1. A light emitting device comprising:
   a plurality of LED chips comprising a first LED chip and a second LED chip,
   each of the plurality of LED chips comprising:
   a substrate;
   a light emitting region that is formed on the substrate;
   an electrode that is connected to the light emitting region and is formed on the substrate;
   one or more through-holes that penetrate the substrate; and
   one or more wirings, each passing through the one or more through-holes of the first LED chip and the one or more through-holes of the second LED chip that is adjacent to the first LED chip, and that electrically connecting the electrode of the first LED chip and the electrode of the second LED chip,
   wherein
   with regard to each of the first LED chip and the second LED chip, a tip-end part of each of the one or more wirings passing through the one or more through-holes has, at a cross section when cut at a plane that is parallel with a first principle surface of the substrate, a larger cross-sectional area than a cross-sectional area of each of the one or more wirings inside the one or more through-holes,
   the substrate of the first LED chip and the substrate of the second LED chip are separated, and the each of the one or more wirings links the first LED chip and the second LED chip.

2. The light emitting device according to claim 1, wherein the tip-end part is bent along the first principle surface of the substrate.

3. The light emitting device according to claim 1, wherein the tip-end part is present on a second principle surface that is on the opposite side of the substrate to the first principle surface on which the light emitting region is formed.

4. The light emitting device according to claim 1, wherein
each of the one or more wirings has a stretchable structure between two of the LED chips that are adjacent to each other.

5. The light emitting device according to claim 1, wherein
each of the one or more wirings has a main wiring part that connects three or more of the LED chips, and an auxiliary wiring part that branches from the main wiring part to each of the LED chips, the main wiring part is formed along a second principle surface that is on the opposite side of the substrate to the first principle surface on which the light emitting region is formed, and the auxiliary wiring part is positioned inside the one or more through-holes.

6. The light emitting device according to claim 1, wherein
the plurality of LED chips further comprises a third LED chip that is adjacent to the first LED chip, each of the one or more wirings includes first wiring that is inserted through a first through-hole in the first LED chip and a first through-hole in the second LED chip from the first principal surface of the substrate, and second wiring that is inserted through a second through-hole in the first LED chip and a first through-hole in the third LED chip from a second principal surface of the substrate that is on the opposite side of the substrate to the first principle surface.

7. The light emitting device according to claim 1, wherein
a cross-sectional area of each of the one or more through-holes is larger than the cross-sectional area of each of the one or more wirings inside the one or more through-holes.

8. The light emitting device according to claim 1, wherein
the plurality of LED chips are packaged with a resin that is more pliable than the one or more wirings.

9. The light emitting device according to claim 1, wherein
the plurality of LED chips further comprises a third LED chip that is adjacent to the first LED chip at a side different from the second LED chip, and first wiring and second wiring of the one or more wirings pass through one or more through-holes of the first LED chip, the first wiring electrically connecting the electrode of the second LED chip and the electrode of the first LED chip, and the second wiring electrically connecting the electrode of the third LED chip and the electrode of the first LED chip.

10. The light emitting device according to claim 1, wherein
a pore diameter of each of one or more through-holes widens toward a second principle surface on an opposite side to the first principle surface of the substrate on which the light emitting region is formed.

11. A display device, comprising:
the light emitting device according to claim 1.

* * * * *